United States Patent [19]

Kamata et al.

[11] Patent Number: 5,134,301

[45] Date of Patent: Jul. 28, 1992

[54] ION IMPLANTING APPARATUS, HAVING ION CONTACTING SURFACES MADE OF HIGH PURITY SILICON, FOR FABRICATING SEMICONDUCTOR INTEGRATED CIRCUIT DEVICES

[75] Inventors: Tadashi Kamata, Kokubunji; Jun Sugiura, Musashino; Mitsuharu Honda, Ohme, all of Japan

[73] Assignee: Hitachi, Ltd., Tokyo, Japan

[21] Appl. No.: 547,018

[22] Filed: Jul. 2, 1990

[30] Foreign Application Priority Data

Jun. 30, 1989 [JP] Japan .................................. 1-169137
Mar. 19, 1990 [JP] Japan .................................. 2-67014

[51] Int. Cl.$^5$ ............................................. H01J 37/00
[52] U.S. Cl. ............................................... 250/492.2
[58] Field of Search ......................... 250/492.2, 492.21

[56] References Cited

U.S. PATENT DOCUMENTS

| | | | |
|---|---|---|---|
| 4,450,031 | 5/1984 | Ono et al. .................... | 118/620 |
| 4,682,566 | 7/1987 | Aitken ........................... | 250/492.2 |
| 4,904,902 | 2/1990 | Tamai et al. .................. | 250/492.21 |

FOREIGN PATENT DOCUMENTS 0217616 9/1985 European Pat. Off. .
61-13542 1/1986 Japan .

OTHER PUBLICATIONS

Nuclear Instruments and Methods ... Research, B37/38 (1989)—pp. 584-587.

Primary Examiner—Jack I. Berman
Assistant Examiner—James Beyer
Attorney, Agent, or Firm—Antonelli, Terry Stout & Kraus

[57] ABSTRACT

An ion injecting apparatus and a process for fabricating a semiconductor integrated circuit device by using the ion implanting apparatus is provided. When a wafer, e.g., a Si wafer, is to be implanted with ions, an electrode or the like made of a highly pure Si material is used to achieve a high throughput and a high density implantation. This serves to prevent the occurrence of contamination due to sputtering of the electrode member along the beam passage in the ion implanting apparatus during the high density beam implantation.

19 Claims, 25 Drawing Sheets

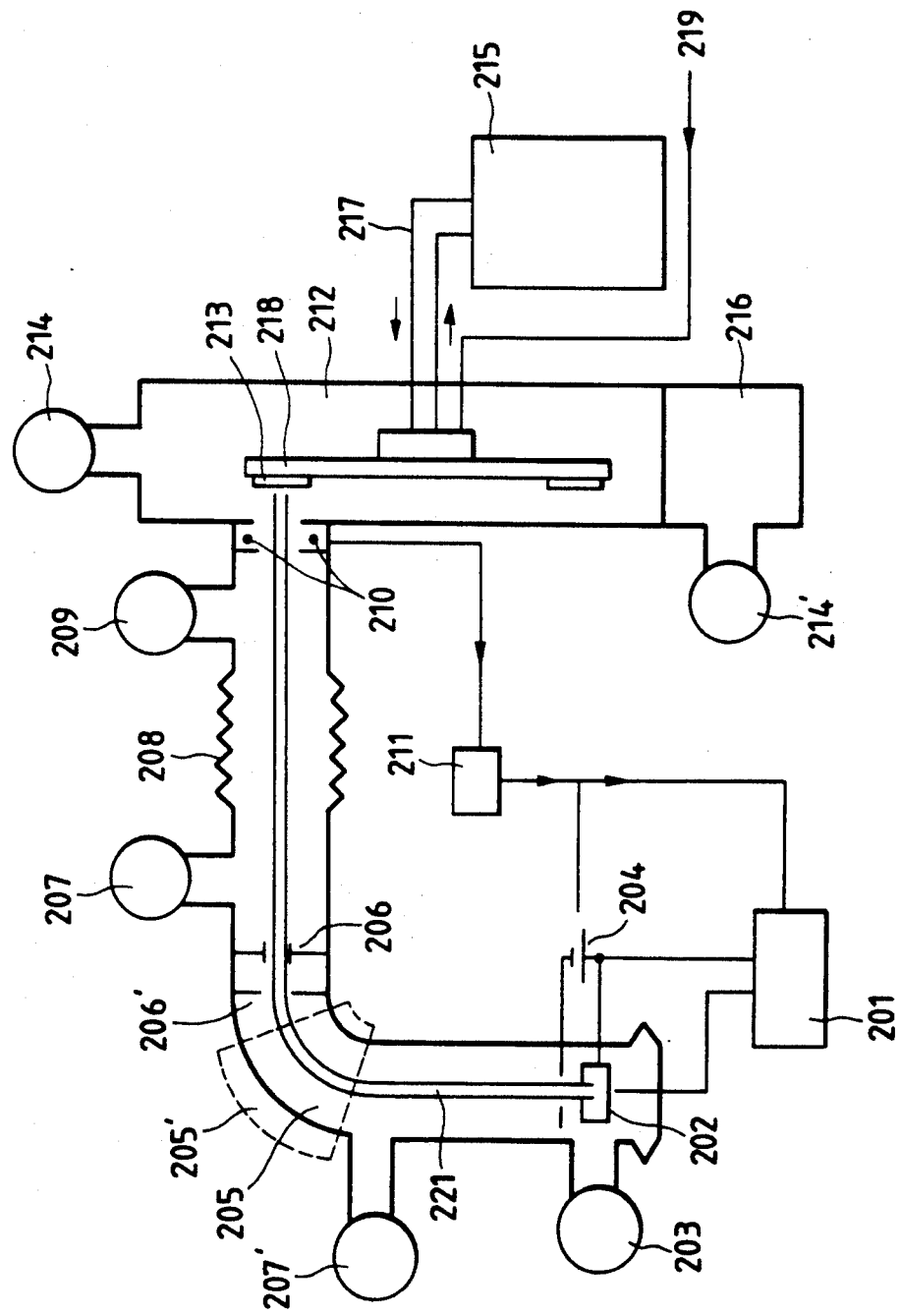

FIG. 34(a)   $P_2^+ + A \longrightarrow P^+ + P + A$

FIG. 34(b)   $P^{++} + A \longrightarrow P^+ + A^+$

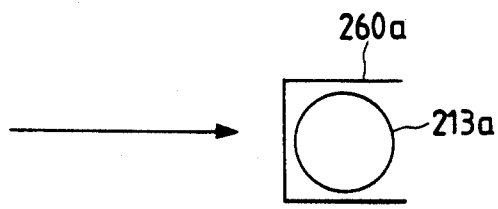
FIG. 37(a)
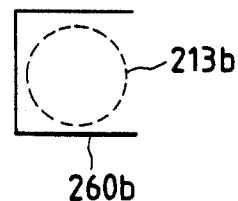
FIG. 37(b)
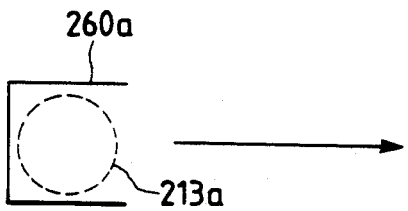
FIG. 37(c)
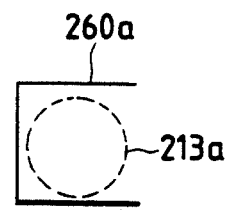
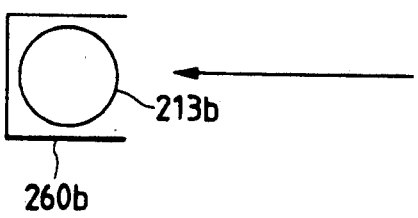
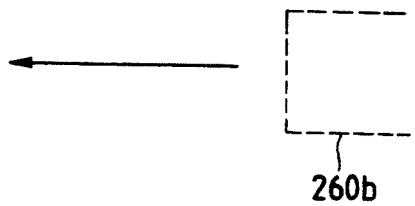

ION IMPLANTING APPARATUS, HAVING ION CONTACTING SURFACES MADE OF HIGH PURITY SILICON, FOR FABRICATING SEMICONDUCTOR INTEGRATED CIRCUIT DEVICES

BACKGROUND OF THE INVENTION

The present invention relates to an ion implantation technique to be used for fabricating a semiconductor integrated circuit device and, more particularly, to a technology which is effective when applied for cleaning an ion implanting apparatus.

In the process for fabricating a semiconductor integrated circuit device, a semiconductor region (of pn junction) such as a well region, a channel stopper region or a source or drain region is typically formed by doping a semiconductor substrate (or wafer) with an impurity by using the ion implantation technology. This ion implantation is advantageous in that the impurity concentration of the substrate can be more finely controlled than by the thermal diffusion method because the dosage of the impurity ions can be measured. Since, moreover, the energy of the impurity ions can be controlled, the ion implantation is advantageous in that the impurity profile of the substrate can be more finely controlled than the thermal diffusion method.

In the ion implanting apparatus to be used in the so-called "SIMOX (Separation by Implanted Oxygen)", i.e., the technology for forming an $SiO_2$ film by implanting oxygen in a high concentration, an ion-beam passage tube is lined with a quartz tube or cover so as to prevent the contamination by the sputtering from the ion-beam passage. This technology is disclosed on pp. 299 to 303 of "Nuclear Instruments and Methods in Physics Research" B37/38 (1989) of Izumi et al. issued by North Holland.

SUMMARY OF THE INVENTION

According to the ion implantation, however, an impurity of high energy is introduced into the substrate so that defects are liable to be induced in the substrate. The defects cause a problem that the elements have their electric characteristics deteriorated. After the ion implantation, therefore, an annealing treatment is indispensable for removing the defects induced in the substrate and for activating the implanted impurity ions electrically.

In very large scale integrated (VLSI) circuits fabricated according to the sub-micron design rules, such as a memory LSI (of Si monolithic type) of Megabits in recent years, the process has to be accomplished at a lower temperature so as to form a very shallow pn junction of about 0.1 to 0.2 microns in the active region of the substrate so that the annealing treatment after the ion implantation has to be accomplished at a lower temperature. In the process for fabricating the VLSI, therefore, the contamination of the substrate at the time of ion implantation has to be minimized to remove the defects efficiently.

One of the causes for the contamination of the substrate at the time of ion implantation is the sputtering of the ion implanting apparatus. This is the phenomenon in which the ion beam emitted from the ion source of the ion implanting apparatus partially impinges upon the extraction electrode, analyzer or analyzing slit in the apparatus, while it is passing therethrough, to sputter their surfaces so that the produced substance sticks to the surface of the substrate or is driven into the substrate by the ions. Since the parts of the ion implanting apparatus such as the lead-out electrode, analyzer inner wall or analyzing slit are typically made of graphite or aluminum in the prior art, the substrate will be contaminated with the carbon or aluminum if the parts have their surfaces sputtered. Since, moreover, the graphite has an purity as low as 99.99 to 99.999%, it is impossible to avoid the contamination with a heavy metal such as Fe or Cu contained as an impurity in the graphite. Especially, in case a semiconductor region of high impurity concentration such as $10^{15}$ atoms/cm$^2$ such as the source or drain region of the MOS.FET is to be formed, a high current type ion implanting apparatus having a large beam current is used to cause a serious problem that the substrate is contaminated by the large amount of contaminating substance produced by the sputtering.

Moreover, the cover made of an insulator such as quartz cannot prevent the charge-up at the covered portion. In addition, in case the oxygen is sputtered and introduced into the Si substrate and so on, detrimental influences such as the knock-on phenomenon cannot be avoided. As is well known, the knock-on phenomenon occurs when ions other than oxygen ions are implanted through a thin oxide film into a silicon surface. The mechanism of this is that an accelerated ion collides with an oxygen ion in the oxide film, and the momentum of the accelerated ion transfers to the oxygen ion. This serves to implant the oxygen ion into the silicon surface, and this implanted oxygen ion comes to be a generating source of various crystalline defects.

An object of the present invention is to provide a technology capable of effectively preventing the contamination of the substrate, which might otherwise be caused by the sputtering of the ion implanting apparatus.

An object of the present invention is to provide an ion implanting apparatus capable of accomplishing the ion implantations while cooling the wafer stably at a temperature of 0° C. or lower.

An object of the present invention is to provide an ion implanting apparatus capable of preventing the charge-up of the wafer effectively.

An object of the present invention is to provide an ion implanting apparatus which is freed from the contamination from a wafer stopper or the like.

An object of the present invention is to provide an ion implanting apparatus having an evacuating system capable of keeping a high vacuum all over the ion passage.

An object of the present invention is to provide an ion implanting apparatus suitable for a multivalent or molecular ion implantation.

An object of the present invention is to provide an ion implanting apparatus having a condensation preventing mechanism capable of preventing the moisture condensation when the wafer is extracted to the outside.

An object of the present invention is to provide an ion implanting apparatus which is freed from the dielectric breakdown of the wafer even if the electronic shower experiences operating difficulties.

An object of the present invention is to provide an ion implantation technology capable of keeping an implanted layer from becoming defective even by a cold annealing at a temperature of 900° C. to 800° C. or lower.

An object of the present invention is to provide an ion implantation technology capable of making a deeply implanted layer substantially without defects.

An object of the present invention is to provide a semiconductor integrated circuit device fabricating process suitable for forming a fine diffusion layer (or doped layer).

An object of the present invention is to provide an ion implantation technology having a high throughput.

An object of the present invention is to provide an impurity doping technology capable of forming a fine and deep diffusion layer (or doped layer).

An object of the present invention is to provide an ion implantation technology capable of coping with the design rules of 0.5 to 0.3 microns or smaller.

An object of the present invention is to provide an ion implanting apparatus having an evacuating system capable of holding the degree of vacuum of a downstream step acceleration tube at about $5 \times 10^{-6}$ Torrs or higher during the ion implantation.

An object of the present invention is to provide an ion implanting apparatus capable of implanting ions while keeping the wafer temperature at 0° to 50° C. or lower.

An object of the present invention is to provide a semiconductor integrated circuit device fabricating process having a shallow, diffusion layer (or doped) layer of 0.1 microns or less which is substantially without defects.

A summary of a representative embodiment of the invention to be disclosed hereinafter will be briefly described in the following.

According to one feature of the present invention, there is disclosed an ion implanting apparatus which is constructed such that at least the surface of a member disposed in the passage of an ion beam is made of highly pure silicon.

According to the above-specified means, the substance, which is produced when the surface of the member disposed on the passage of the ion beam is sputtered, is a substance (e.g., silicon) having a composition identical to that of the substrate, so that it will not provide a contamination source of the substrate. Since, moreover, the silicon is made to have a purity of 99.99999999% or more, the substrate is prevented from being contaminated with an impurity such as a heavy metal contained in the above-specified substance.

The summaries of other features of the present invention for achieving the aforementioned objects and their operations will be described in the following.

(1) By dropping the temperature of the wafer being implanted to 0° to −100° C. (or −200° C.), the defects to be caused during the implantation are reduced to prevent the crystal defects. The cooling method includes: ① The wafer back has its contact portion cooled to about −20° to −120° C. (or −200° C.) with a coolant which has been cooled down by a refrigerator. In order to improve the heat conductivity between the wafer and the cooled portion, gases are introduced into the gap between the wafer and the cooled side.

② In the cooling method of the wafer back contact portion, by applying the principle of the cryo-pump, the cooled portion is used as a cold head. As a result, the cooled portion is cooled down to −20° to −120° C. (or −200° C.). In this case, too, gases are introduced into the gap between the wafer and the cooled side to improve the heat conductivity.

Moreover, the moisture condensation is prevented when the wafer is extracted to the atmosphere after the end of the implantation. For this, ① after the end of the implantation in the vacuum, the wafer is heated to a temperature free from the condensation by using an infrared lamp. ② At the end of the implantation, the wafer is transferred from the implantation chamber to a preparatory vacuum chamber, and the atmospheric pressure is gradually restored with dried hot nitrogen.

(2) The electronic shower generator for preventing the dielectric breakdown of the device on the wafer surface is additionally given the following functions. In the electronic shower generator of the prior art, more specifically, no electron is supplied for a while (of several tens millisec. to several sec.), in case the electronic shower is interrupted by troubles during the implantation, so that the device may possibly be broken. Despite this possibility, the device can be prevented from being broken by making an electronic shower (i.e., electron releasing current) monitor and an ion source or lead-out electrode power source electrically associative so that the ion beam may be shielded simultaneously with the occurrence of the troubles even in case the electronic shower generator is troubled during the implantation.

(3) If the beam impinges upon the wafer stopper or the like for holding the wafer, the aluminum making the wafer stopper and the impurity contained in the same is sputtered to contaminate the wafer. In order to prevent this contamination, ① nothing but the wafer is hit by the ion beam by eliminating the mechanical stopper and by fixing the wafer with an electrostatic chuck. ② The substance sputtered to come out is prevented from flying to the wafer by improving the purity of the mechanical stopper (to 3N, i.e., 99.9% or higher) and the shape of the surface to be hit by the beam.

(4) In order to prevent the energy contamination of the multivalent or molecular ion implantations, the ion implanting apparatus is given the following functions: ① A beam filter is disposed at the exit of a mass analyzing tube to make it possible to eliminate the contamination caused from the ion source to the exit of the mass analyzing tube. ② Between the mass analyzing tube and the downstream step acceleration tube, there is interposed a high vacuum pump to establish a vacuum at [(Mean free step of ions)$\geq 10\times$(Distance from the exit of the mass analyzing tube to the exit of the downstream step acceleration tube)] from the exit of the mass analyzing tube to the inside of the downstream step acceleration tube. ③ At totally two positions, i.e., between the exit of the mass analyzing tube and the downstream step acceleration tube and at the exit of the downstream step acceleration tube, there is interposed two high vacuum pumps to establish a vacuum at the same level as that of the foregoing function ②.

(5) In order to prevent the contamination due to the sputtering from the individual electrodes in the ion passage, the portion to be possibly sputtered, such as the lead-out electrode of the ion source, the analyzing slit or beam filter slit of the mass analyzer, or the downstream step acceleration electrode (or wafer stopper), or the surface of that portion is covered with such a conducting substance as will not act as a contaminant even if sputtered. The electrode plate as a whole may be made of such (highly pure) substance.

In case the wafer to be treated is made of Si, more specifically, the portion of the electrode to be possibly sputtered may be suitably doped with Si. The aforementioned electrode to be used is prepared by machining a disc cut from the Si ingot having a resistivity of about 10Ω-cm, which has been grown by the pull-up method by adding suitable one or more kinds of impurities to a Si material having an impurity concentration of 99.9999999%, for example.

As a result, it is possible to form an ion passage which has neither the charge-up nor the contamination.

(6) In the ion implantation, generally speaking, the beam is deflected about 30 degrees after the mass analysis so as to improve the impurity of the ions. In order to implant the ion beam of high concentration efficiently, according to the present invention, the beam passage is made as short as possible to guide the beam into the treated wafer without deflecting the whole beam effectively (excepting the converging lens of the beam itself) after the analysis.

In order to minimize the shadow effect in accordance with the fine structure of the device, moreover, an arrangement is made to make the beam incident at right angles upon the wafer surface to be treated.

BRIEF DESCRIPTION OF THE DRAWINGS

FIG. 19 is a diagram showing the whole structure of an ion implanting apparatus according to Embodiment 2 of the present invention;

FIG. 34 is a diagram showing the interactions or reactions between the undesired ions and between the ions-molecules in the ion beam passage;

FIG. 37 shows at (a) to (c) the treating situations of the wafer in the load locking chamber shown in FIG. 36.

DESCRIPTION OF THE PREFERRED EMBODIMENTS

Embodiment 1

Figure 4:
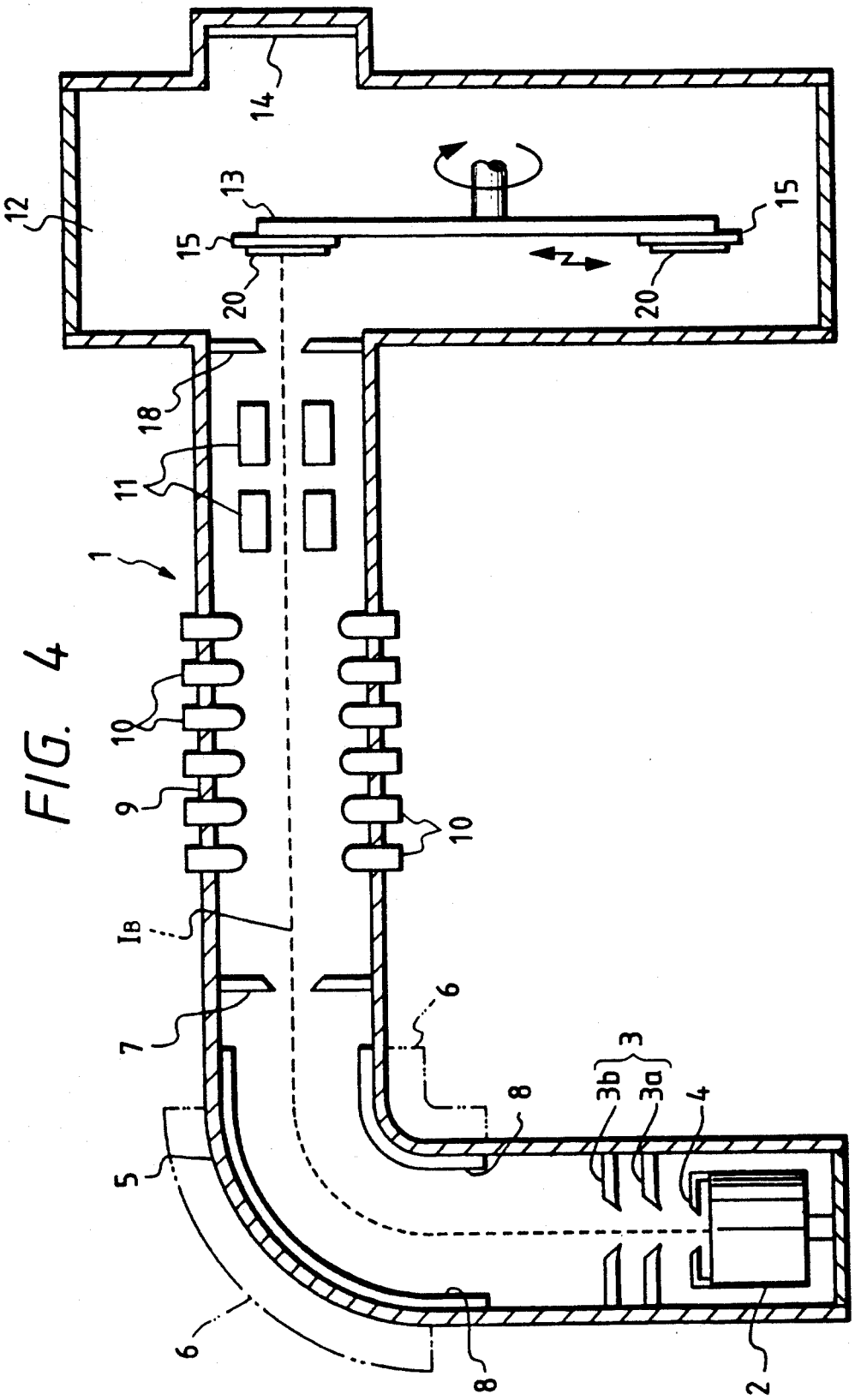
FIG. 4 is a schematic front elevation showing the ion implanting apparatus.

FIG. 4 shows an essential portion of the ion implanting apparatus according to Embodiment 1 of the present invention.

The ion implanting apparatus 1 is of a high current type for generating a beam current of 1 to 20 [mA] or more at the maximum. An ion source 2 is disposed at one end of the ion implanting apparatus 1 for generating ions from a gaseous element by making use of thermions emitted from a filament in a magnetic field, for example. The ions thus generated by the ion source 2 are extracted from an extraction slit 4 by a voltage applied between the ion source 2 and an extraction electrode 3 and are then converged into an ion beam $I_B$ by a pair of electrodes (i.e., acceleration and deceleration electrodes) 3a and 3b constituting the extraction electrode 3.

A mass analysis system 5 is disposed adjacent to the extraction electrode 3 for selecting ions of the kind necessary for the implantation from the various ions generated by the ion source 2. The mass analysis system 5 is constructed to include a sector-shaped mass analyzing electromagnet (or analyzer) 6 and a analysis slit 7 arranged at the focal point of the electromagnet 6. The passage for the ion beam $I_B$ has its side wall lined, as at 8, to prevent the side wall from being melted or mixed with an impurity by the irradiation of the ion beam $I_B$.

An acceleration tube 9 is disposed adjacent to the aforementioned mass analysis system for imparting a predetermined energy to the ions of the kind selected by the mass analysis system 5. The acceleration tube 9 is of a multi-step structure including a plurality of acceleration electrodes 10 so that the ions may be accelerated by the electric fields to be established between the individual two of the acceleration electrodes 10.

The ion beam $I_B$ thus energized by the acceleration tube 9 is converted by a converging lens 11 and is introduced through a slit 18 into an implantation chamber 12. This implantation chamber 12 is centralized by a rotating disc 13 which is backed by a beam stopper 14 for absorbing the ion beam $I_B$. The rotating disc 13 is arranged at its circumferential edge of a predetermined spacing with substrate holders 15 for fixing substrates (or wafers) 20. In short, the ion implanting apparatus 1 adopts the batch method, in which the plural substrates 20 are implanted altogether with the ions. For this ion implantation, the rotating disc 13 is moved vertically or horizontally, while rotating at a high speed, to irradiate the whole surfaces of the substrates 20 fixed on the substrate holder 15 uniformly with the ion beam $I_B$.

Of the members composing the aforementioned ion implanting apparatus 1, according to the present embodiment, the members disposed on the passage (or beam line) of the ion beam $I_B$, such as the extraction slit 4, the extraction electrode 3, the analysis slit 7, the liner 8, the acceleration electrode 10, the converging lens 11, the slit 18, the substrate holder 15 and the beam stopper 14 are or have their surfaces made of highly pure silicon.

Figure 1:
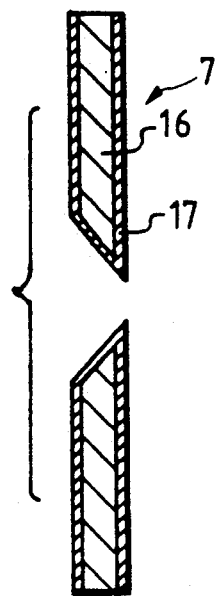
FIG. 1 is a section taken along line I—I of FIG. 2 and shows one member of an ion implanting apparatus according to Embodiment 1 of the present invention.
Figure 2:
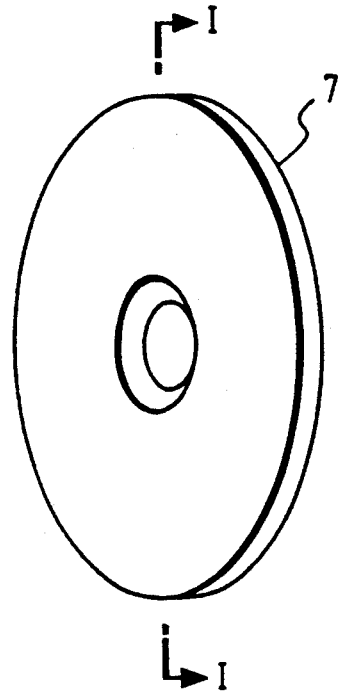
FIG. 2 is a perspective view showing one embodiment of the ion implanting apparatus.

For example, the analysis slit 7, as shown in FIGS. 1 and 2, is constructed by coating a disc-shaped graphite core 16 with a thin film 17 of highly pure silicon. Although not shown, the aforementioned extraction slit 4, extraction electrode 3, liner 8, acceleration electrode 10, converging lens 11, slit 18, substrate holder 15 and beam stopper 14 are also constructed by coating the cores 16 of graphite or aluminum with the thin films 17 of highly pure silicon.

These thin film 17 is made of amorphous silicon deposited on the surface of the core 16 to have a thickness of about 100 microns by the CVD method, for example. This amorphous silicon has a purity of 99.99999999% (as called the "ten nines") or more. The amorphous silicon making the thin film 17 can also be deposited by the sputtering method. In this case, the sputtering is accomplished by using a target made of single crystalline or polycrystalline silicon having a purity of the ten nines or more.

The individual ones of the aforementioned members disposed on the passage of the ion beam $I_B$ may be made of silicon of low resistance (i.e., doped silicon) having its core 16 doped with an impurity to have a resistance of about 10 to several hundreds $\Omega$ cm, for example. Moreover, the thin film 17 may be made of not only the aforementioned amorphous silicon but also the silicon which is grown on the surface of the core 16 to have a purity of the ten nines or more by the epitaxial method.

The aforementioned members disposed on the passage of the ion beam $I_B$ may be partially made of silicon having a purity of the ten nines or more. Since, in this case, the members are insulating, at least their surfaces are given a low resistance (for example, a resistivity of 10 $\Omega$ cm) by the irradiation of a neutron beam or by the doping of an impurity so as to prevent the adverse influences due to the charge-up.

Figure 3:
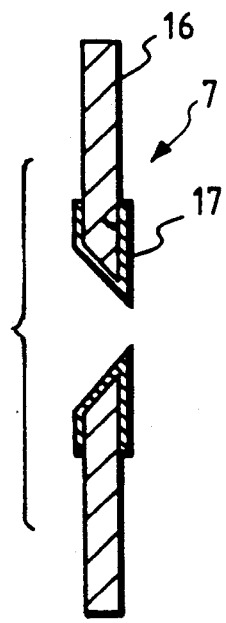
FIG. 3 is a section showing one embodiment of the ion implanting apparatus according to another example of the Embodiment 1 of the present invention.

The individual ones of the aforementioned members disposed on the passage of the ion beam $I_B$ may be made of highly pure silicon only at their portions to be irradiated with the ion beam $I_B$. Specifically, the aforementioned analysis slit 7 shown in FIGS. 1 and 2 is covered all over its surface with the thin film 17 of highly pure silicon. Like the analysis slit 7 shown in FIG. 3, for example, only that portion of the surface of the core 16 of graphite, which is irradiated with the ion beam $I_B$, may be covered with the thin film 17 of highly pure silicon.

Thus, in the ion implanting apparatus 1 of the present embodiment, the extraction slit 4, extraction electrode 3, analysis slit 7, liner 8, acceleration electrode 10, converging lens 11, slit 18, substrate holder 15 and the beam stopper 14 disposed on the passage of the ion beam $I_B$ have their individual surfaces made of silicon having a purity of the ten nines or more. As a result, the substance, which is generated when the surfaces of those members are sputtered with the ion beam $I_B$, has its composition shared with the substrate 20 to prevent the substrate 20 from being subjected to any contamination.

Since, moreover, the contents of elements other than the silicon contained in that substance are remarkably fine, the substrate 20 is not subject to the contamination with an impurity such as a heavy metal.

Next, one example of a semiconductor integrated circuit device fabricating process using the aforementioned ion implanting apparatus 1 will be described in the following. This fabricating process is applied to memory cell selecting MOS. FETs Qs constituting the memory cells of a DRAM (Dynamic Random Access Memory) and n-channel MOS. FETs and p-channel MOS. FETs Qp constituting the peripheral circuits. The specific fabricating process will be described in the following with reference to FIGS. 5 to 18 (presenting sections showing an essential portion at the individual steps of the processing process). Incidentally, the DRAM is fabricated by the so-called "0.5 microns design rules to have a capacity of 16 Megabits and the minimum working size of 0.5 microns.

Figure 5:
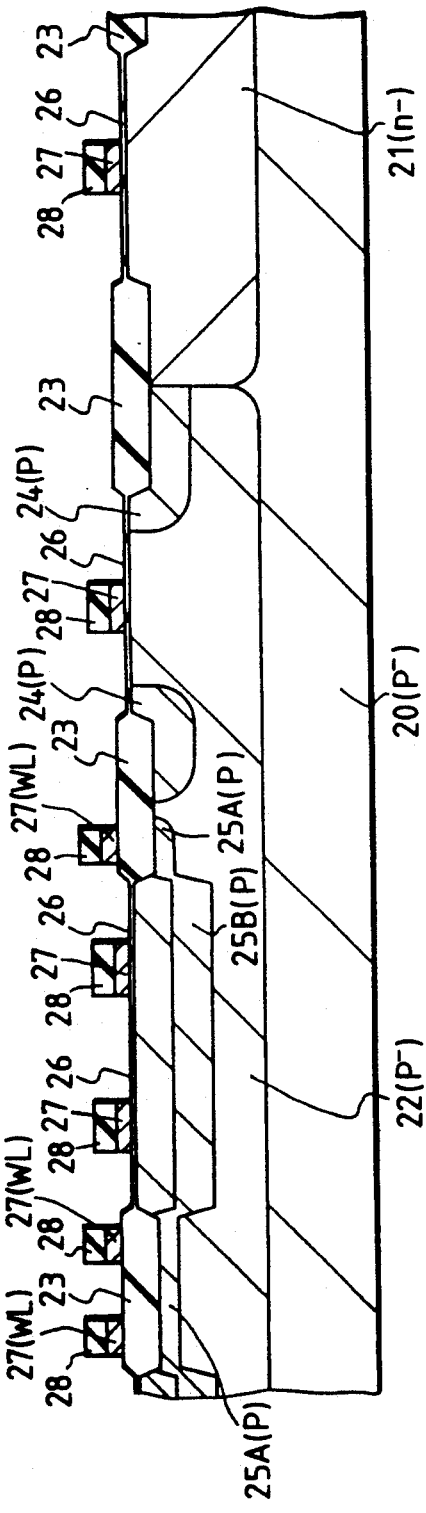
FIGS. 5 to 18 are sections showing an essential portion of the semiconductor substrate and shows a process for fabricating a semiconductor integrated circuit device by using the ion implanting apparatus (according to Embodiment 1 or 2)

FIG. 5 is a section showing an essential portion of the semiconductor substrate (or wafer) at an intermediate step of the DRAM fabricating process. The individual principal planes of the memory cell forming region (at the lefthand side of FIG. 5) and the n-channel MOS. FET Qn forming region (at the center of FIG. 5) of the substrate 20 made of a $p^-$-type single crystalline silicon are formed with a $p^-$-type well region 22. This $p^-$-type well region 22 is formed by introducing B (or $BF_2$) of an impurity concentration of about $10^{12}$ to $10^{13}$ atoms/cm$^2$ by the ion implantation method using an energy of about 20 to 30 KeV and by heating the substrate 20 in an atmosphere at a high temperature of about 1,100° to 1,300° C. The principal plane of the p-channel MOS. FET Qp forming region (at the righthand side of FIG. 5) of the peripheral circuit is formed with an $n^-$-type well region 21. The $n^-$-type well region 21 is formed by implanting P (phosphor) of an impurity concentration of about $10^{13}$ atoms/cm$^2$ by the ion implantation method using an energy of about 120 to 130 KeV and by heating the substrate 20 in an atmosphere at a high temperature of about 1,100° to 1,300° C.

The individual principal planes of the aforementioned well regions 21 and 22 are formed with an element separating field insulating film 23 having a thickness of about 400 to 600 nm. This field insulating film 23 is formed by the selective oxidization (i.e., LOCOS) method.

In the region to be formed with the peripheral circuit, the $p^-$-type well region 22 is formed below the field insulating film 23 with a p-type channel stopper region 24. The p-type channel stopper region 24 is formed by introducing BF$_2$ of an impurity concentration of about 10$^{13}$ atoms/cm$^2$ into the principal plane of the p$^-$-type well region 22 by the ion implantation method using an energy of about 50 to 70 KeV, by heating the substrate 20 at a high temperature of about 1,050° to 1,150° C. for about 30 to 40 min. in a nitrogen gas atmosphere containing a minute amount (about 1% or less) of oxygen, and by a subsequent oxidization for about 30 to 50 min. By this heat treatment, the impurity introduced into the principal plane of the p$^-$-type well region 22 is extended and diffused so that the p-type channel stopper region 24 is formed at the fabrication step substantially shared by the formation of the field insulating film 23.

The principal plane of the memory cell forming region is formed with a p-type channel stopper region 25A and a p-type semiconductor region 25B. The p-type channel stopper region 25A is formed below the field insulating film 23, and the p-type semiconductor region 25B is formed in an active region. The p-type channel stopper region 25A and the p-type semiconductor region 25B are individually formed by implanting B of an impurity concentration of about 10$^{12}$ to 10$^{13}$ atoms/cm$^2$ by the ion implantation method using a high energy of about 200 to 300 KeV. The p-type channel stopper region 25A is formed by introducing the aforementioned impurity through the field insulating film 23, and the p-type semiconductor region 25B is formed so deep in the principal plane of the p$^-$-type well region 22 as to correspond to the thickness of the field insulating film 23.

The individual active regions of the well regions 22 and 21 are formed with a gate insulating film 26 having a thickness of about 12 to 18 nm. This gate insulating film 26 is formed by steam-oxidizing the substrate 20 at a high temperature of about 800° to 1,000° C., for example.

The field insulating film 23 and gate insulating film 26 of the memory cell forming region are individually overlaid by a gate electrode 27 of the memory cell selecting MOS. FET Qs. The gate electrode 27 of the memory cell selecting MOS. FET Qs acts as a word line (WL). In the peripheral circuit forming region, the gate insulating film 26 of the p$^-$-type well region 22 is overlaid by the gate electrode 27 of the n-channel MOS. FET Qn, and the gate insulating film 26 of the n$^-$-type well region 21 is overlaid by the gate electrode 27 of the p-channel MOS. FET Qp. These gate insulating films 27 are made of a polysilicon film having a thickness of about 200 to 300 nm, for example. This polysilicon film is doped with an n-type impurity (P or As) for reducing the resistance. The gate electrodes 27 are formed by depositing a polysilicon film all over the surface of the substrate 20 by the CVD method, by introducing an n-type impurity into the polysilicon film by the thermal diffusion method, by forming a not-shown SiO$_2$ film thereover, and by depositing an inter-layer insulating film 28 having a thickness of about 250 to 350 nm all over the surface of the SiO$_2$ film. The inter-layer insulating film 28 is formed by the CVD method using inorganic silane gases and nitrogen oxide gases, for example, as its source gases. Next, the gate electrodes 27 are formed by anisotropically etching the inter-layer insulating film 28 and the polysilicon film by using the not-shown photoresist mask. Incidentially, the gate electrodes 27 may be formed of a single layer of a refractory metal (Mo, Ti, Ta or W) film or a refractory metal silicide (MoSi$_2$, TiSi$_2$, TaSi$_2$ or WSi$_2$) film. On the other hand, the gate electrodes 27 may be formed of a composite film which is prepared by laminating the aforementioned refractory metal film or its silicide film over the polysilicon film.

Figure 6:
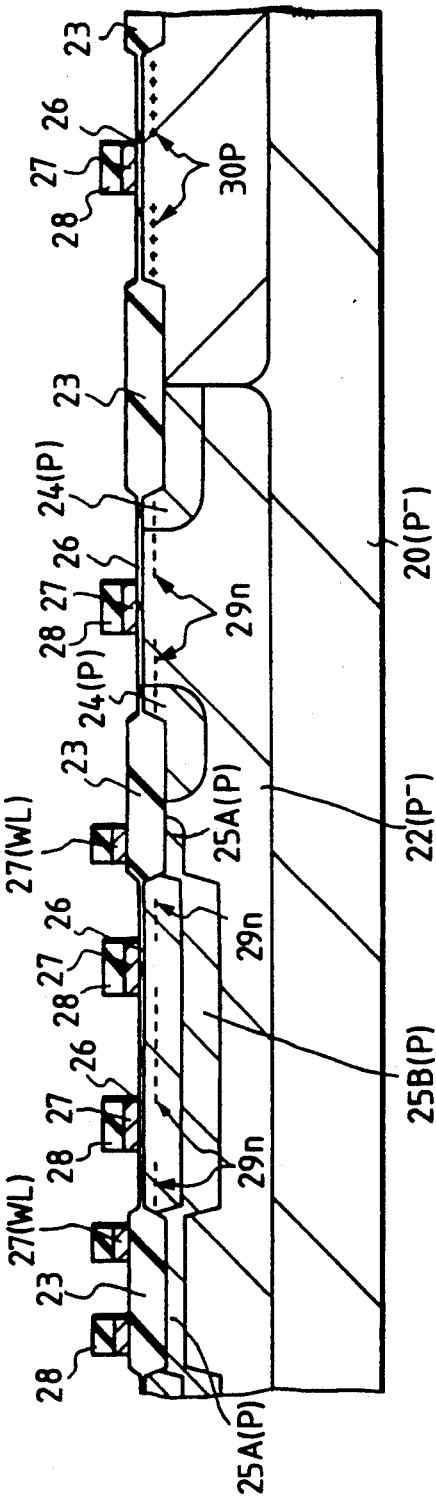

Next, as shown in FIG. 6, the field insulating film 23 and the inter-layer insulating film 28 (or the gate electrode 27) are used as the impurity introduction mask to introduce an n-type impurity 29n into the principal plane of the p$^-$-type well region 22. This n-type impurity 29n is introduced in self-alignment into the gate electrode 27. The n-type impurity 29n to be used is P (or As) having an impurity concentration of about 10$^{13}$ atoms/cm$^2$, for example, and is introduced by the ion implantation method using an energy of about 30 to 50 KeV. Upon the introduction of the n-type impurity 29n, although not shown, the principal plane of the n$^-$-type well region 21 is covered with an impurity introduction mask (e.g., a photoresist film).

Next, the field insulating film 23 and the inter-layer insulating film 28 (or the gate electrode 27) are used as an impurity introduction mask to introduce a p-type impurity 30p into the principal surface of the n$^-$-type well region 21. This p-type impurity 30p is introduced in self-alignment into the gate electrode 27. The p-type impurity 30p to be used is B (or BF$_2$) having an impurity concentration of about 10$^{12}$ atoms/cm$^2$, for example, and is introduced by the ion implantation method using an energy of about 20 to 30 KeV. Upon the introduction of the p-type impurity 30p, although not shown, the principal plane of the p$^-$-type well region 22 is covered with an impurity introduction mask (e.g., a photoresist film).

Figure 7:
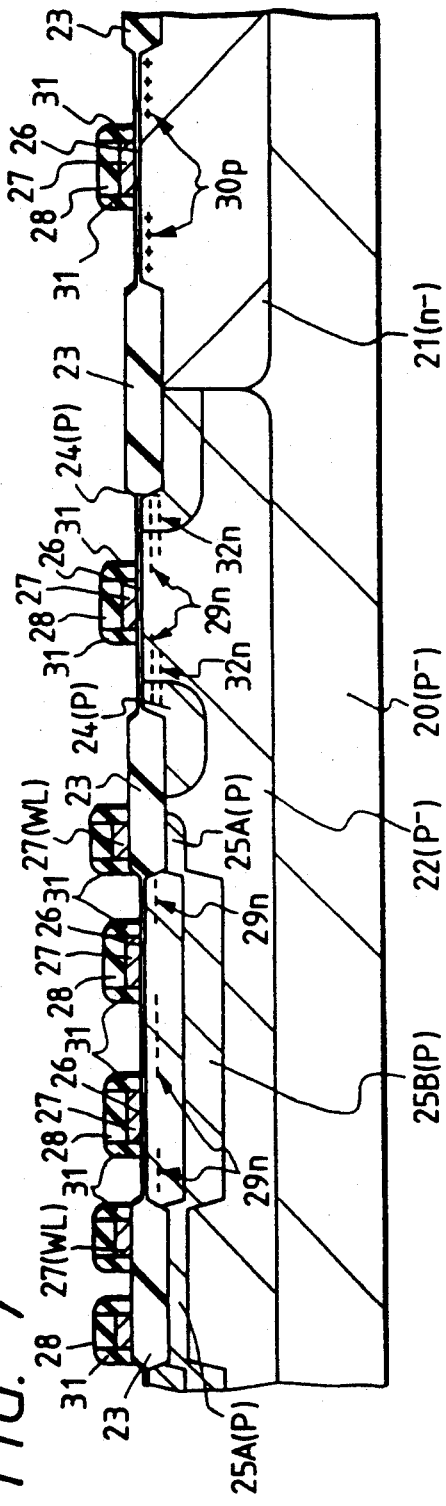

Next, as shown in FIG. 7, the individual side walls of the gate electrode 27 and the overlying inter-layer insulating film 28 are formed with side wall spacers 31. These side wall spacers 31 are formed by depositing a SiO$_2$ film using inorganic silicon gases and nitrogen oxide gases, for example, as the source gases by the CVD method and by accomplishing the anisotropic etching such as the RIE to an extent corresponding to the thickness (e.g., about 130 to 180 nm) of that SiO$_2$ film. The side wall spacers 31 have a length of about 150 nm taken in the direction of the gate (or channel).

Next, an n-type impurity 32n is introduced in the present embodiment into the n-channel MOS. FET Qn forming region of the peripheral circuit by using the aforementioned high current type ion implanting apparatus 1. Upon the introduction of the n-type impurity 32n, the side wall spacer 31 is mainly used as the impurity introduction mask. On the other hand, the regions other than the n-channel MOS. FET Qn forming region are covered with a not-shown impurity introduction mask (or photoresist film). The n-type impurity 32n to be used is As (or P) having an impurity concentration of about 10$^{15}$ atoms/cm$^2$, for example, and is introduced by the ion implantation method using an energy of about 70 to 90 KeV. This ion implantation is accomplished for about ten minutes by turning the rotating disc 13 of the ion implanting apparatus 1 at 1,250 r.p.m.

Figure 8:
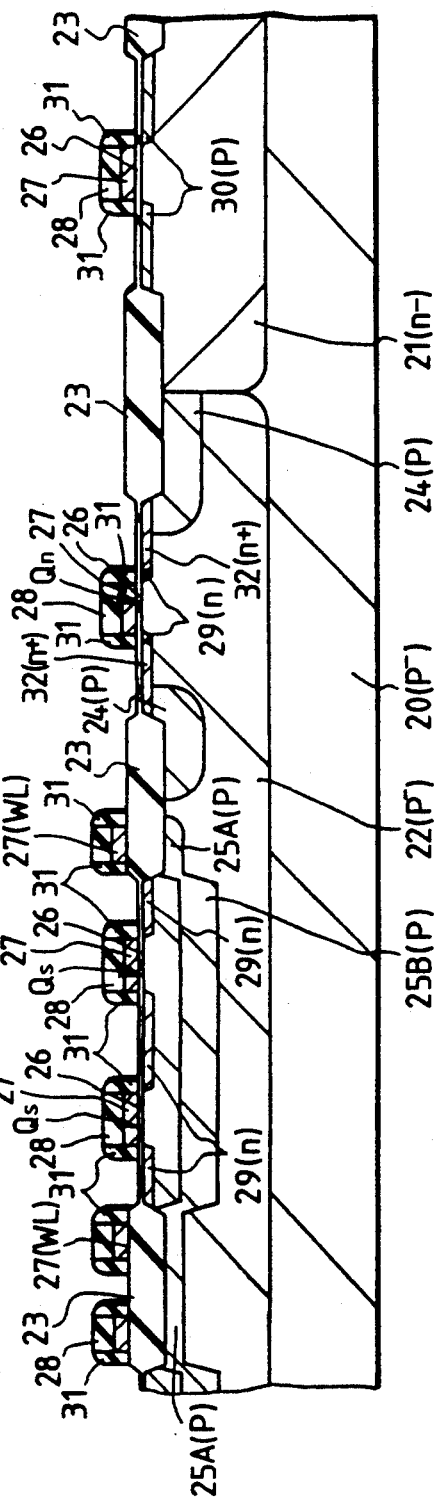

Next, as shown in FIG. 8, by heating the substrate 1, the aforementioned n-type impurity 29n, n-type impurity 32n and p-type impurity 30p are individually extended and diffused to form an n-type semiconductor region 29 of the memory cell selecting MOS.FET Qs, the n-type semiconductor region 29 and n$^+$-type semiconductor region 32 of the n-channel MOS.FET Qn of the peripheral circuit, and a p-type semiconductor region 30 of the p-channel MOS.FET Qp of the peripheral circuit. The aforementioned heat treatment is accomplished for about 20 to 40 min. at a high temperature of about 900° to 1,000° C., for example. The memory cell selecting MOS.FET Qs of the memory cell is completed by forming the n-type semiconductor region 29. Moreover, the n-channel MOS.FET Qn of the peripheral circuit having the LDD structure is completed by forming the n-type semiconductor region 29 and the n+-type semiconductor region 32. Of the p-channel MOS.FET Qp of the peripheral circuit, however, only the p-type semiconductor region 30 forming part of the LDD structure is completed.

Next, an inter-layer insulating film 33 is deposited all over the surface of the substrate 20. This inter-layer insulating film 33 is used as an etching stopper layer when the electrode layer of a laterdescribed information storing capacity element C of the memory cell is to be worked. The inter-layer insulating film 33 is formed to separate the lower electrode layer of the information storing capacity element C and the gate electrodes 27 (or word lines) of the memory cell selecting MOS.FET Qs electrically from each other. The inter-layer insulating film 33 is formed to thicken the side wall spacer 31 of the p-channel MOS.FET Qp. The inter-layer insulating film 33 is formed of a SiO2, which is deposited by the CVD method using the inorganic silane gases and the nitrogen oxide gases, for example, as the source gases, to have a thickness of about 130 to 180 nm.

Figure 9:
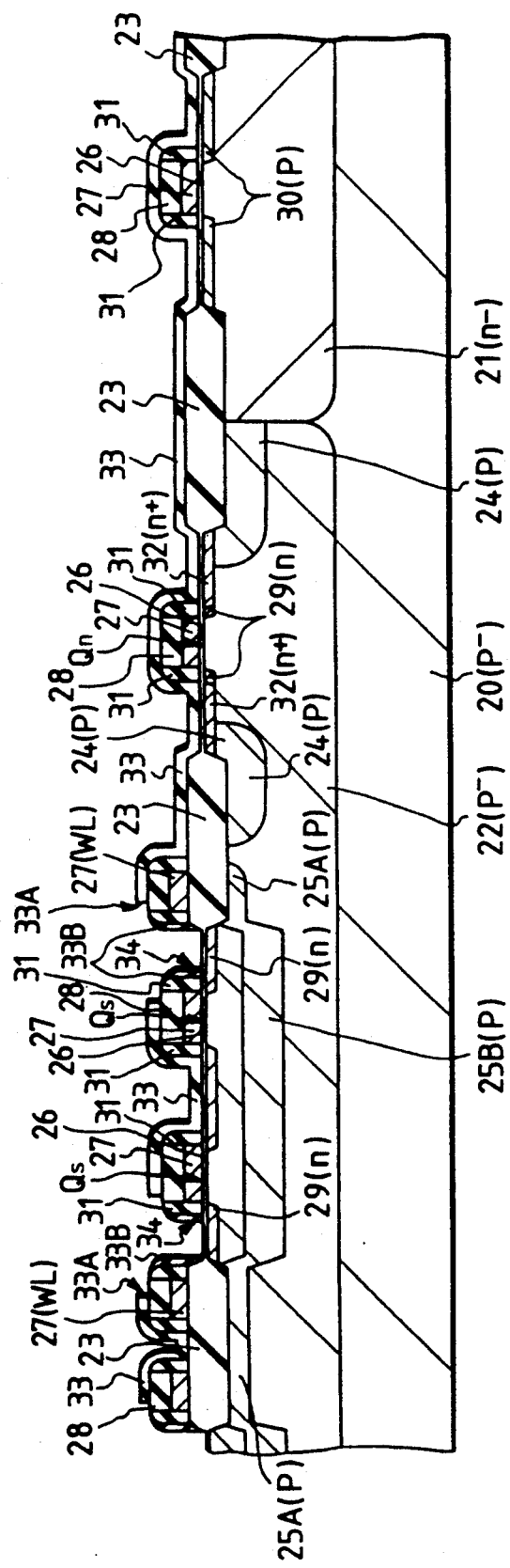

Next, as shown in FIG. 9, the aforementioned inter-layer insulating film 33 is removed from one n-type semiconductor region (at the side to be connected with the lower electrode layer of the information storing capacity element C) of the memory cell selecting MOS.-FET Qs to form connection holes 33A and 34. The connection hole 34 is formed in each of the regions defined by side wall spacers 33B which are deposited on the side wall of the side wall spacer 31 when the side wall spacer 31 and the inter-layer insulating film 33 are etched.

Figure 10:
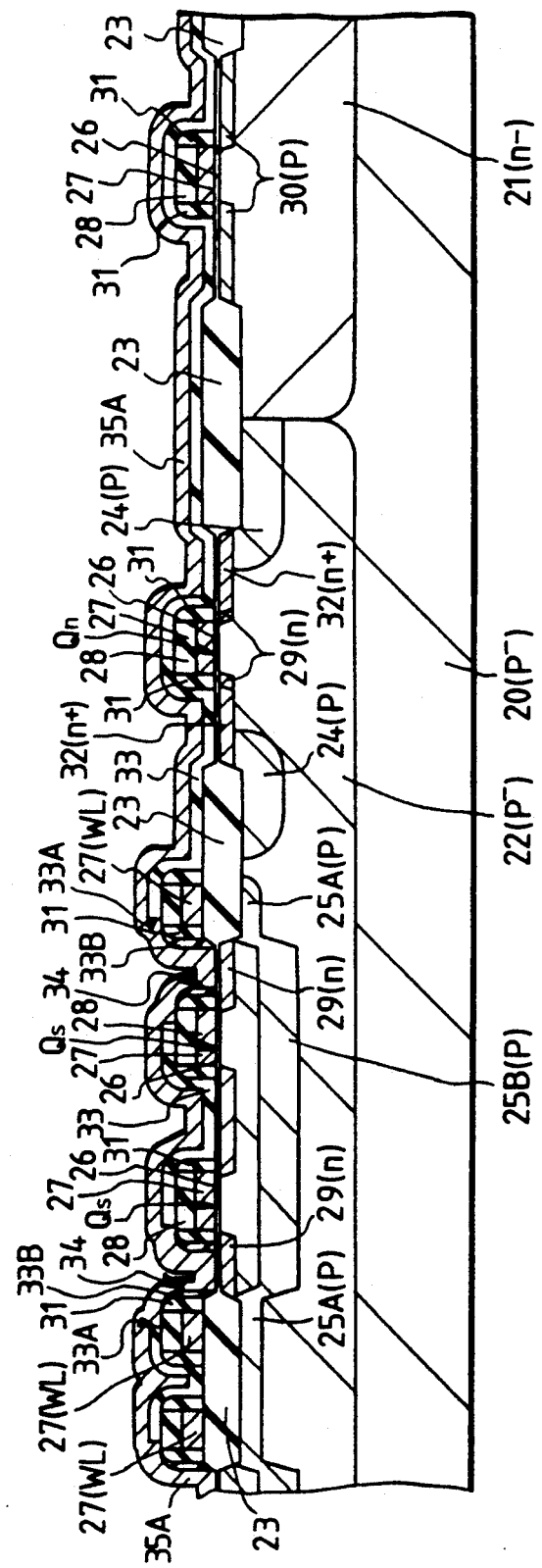

Next, as shown in FIG. 10, a polysilicon film 35A is deposited all over the surface of the substrate 20 to form a lower electrode layer of the information storing capacity element C of the memory cell. This polysilicon film 35A is partially connected with the n-type semiconductor region 29 through the aforementioned individual connection holes 33A and 34. The polysilicon film 35A is deposited by the CVD method to have a thickness of about 150 to 250 nm. Into this polysilicon film 35A, there is introduced by the thermal diffusion method an n-type impurity such as P for reducing the resistance after the deposition. This n-type impurity is introduced in such a low concentration that it is much diffused through the connection hole 34 into the n-type semiconductor region 29 but not to the channel forming region side of the memory cell selecting MOS.FET Qs.

Figure 11:
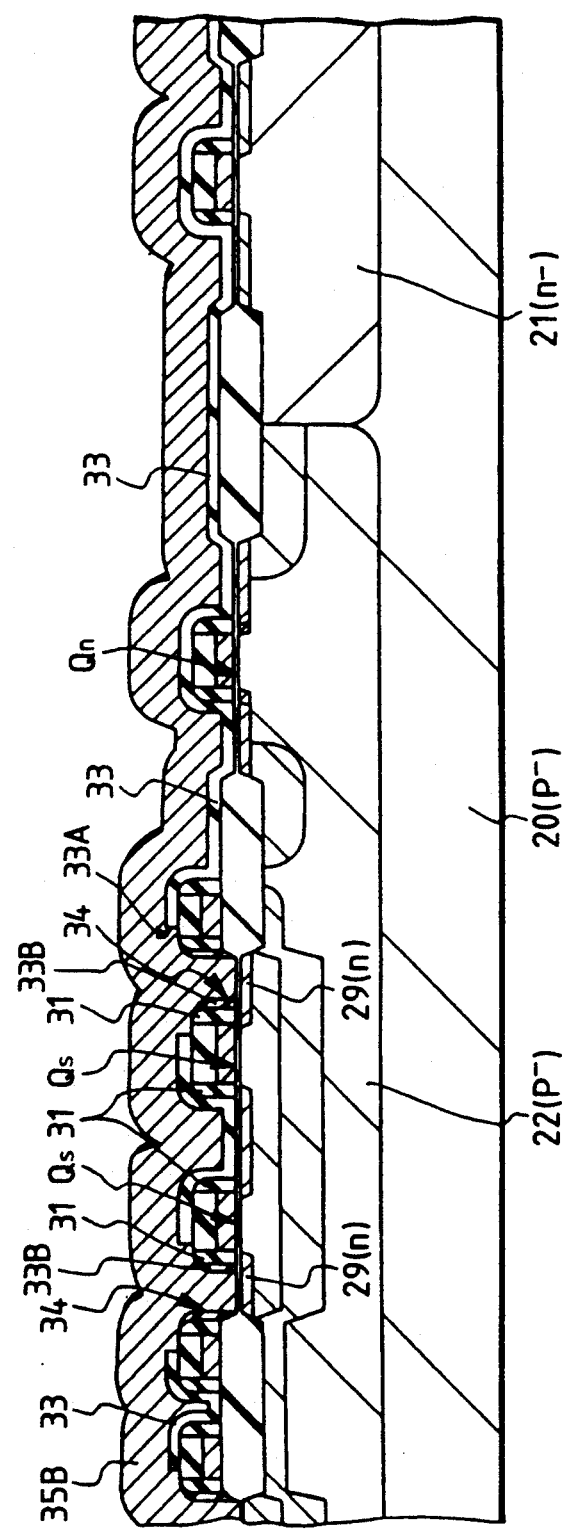

Next, a polysilicon film 35B is further deposited over the aforementioned polysilicon film 35A, as shown in FIG. 11. The upper polysilicon film 35B is deposited by the CVD method to have a thickness of about 250 to 350 nm. After the deposition, there is introduced into the upper polysilicon film 35B by the thermal diffusion method an n-type impurity such as P for reducing the resistance. This n-type impurity is introduced in a high concentration for increasing the amount of charge storage of the information storing capacity element C.

Figure 12:
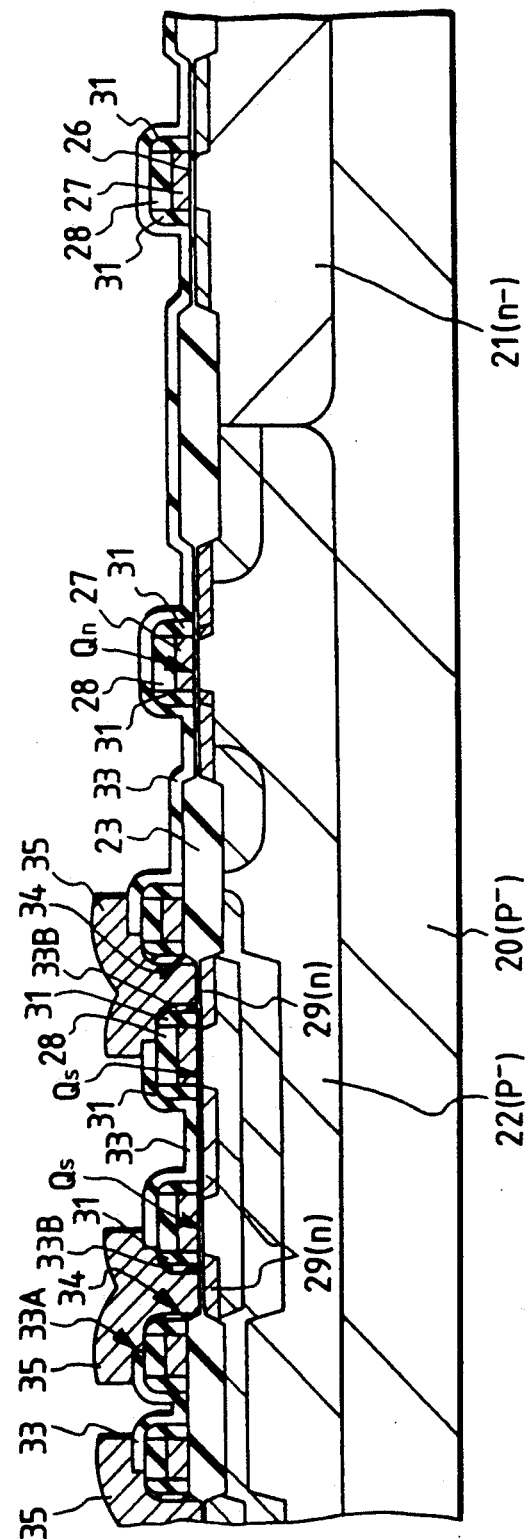

Next, the photolithography technology and the anisotropic etching technology are used to work the aforementioned polysilicon films 35A and 35B of the two-layered structure into predetermined shapes, as shown in FIG. 12, to form a lower electrode layer 35 of the information storing capacity element C.

Figure 13:
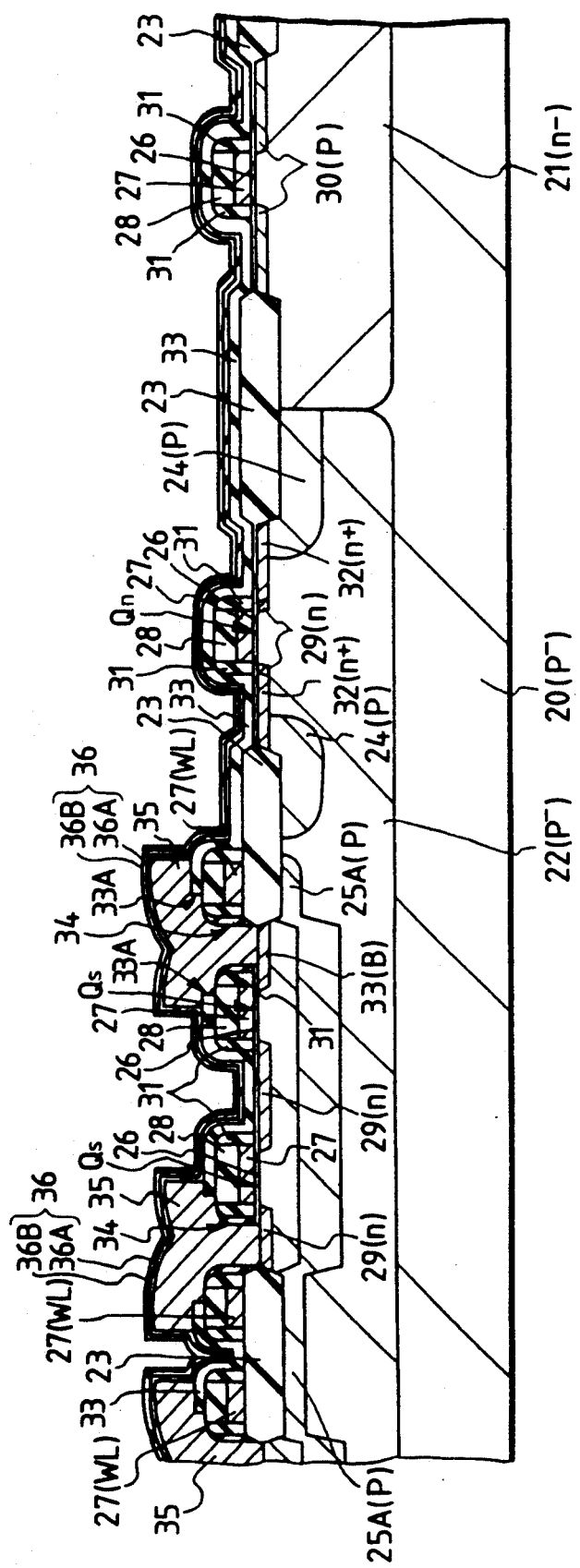

Next, a dielectric film 36 is deposited all over the surface of the substrate 20, as shown in FIG. 13. This dielectric film 36 is formed to have a two-layered structure in which a Si3N4 film 36A and a SiO2 film 36B are sequentially laminated, for example. The Si3N4 film 36A is deposited by the CVD method, for example, to have a thickness of about 5 to 7 nm. In case the Si3N4 36A is deposited at the normal production level over the lower electrode layer (or polysilicon film) 35, a minute amount of oxygen is carried so that a not-shown natural oxide film (e.g., SiO2 film) is formed between the Si3N4 film 36 and the lower electrode layer 35.

The upper SiO2 film 36B of the aforementioned dielectric film 36 is formed by oxidizing the lower Si3N4 film 36A under a high pressure to give a thickness of about 1 to 3 nm.

Next, a not-shown polysilicon film is deposited all over the surface of the substrate 20. This polysilicon film is deposited by the CVD method to have a thickness of about 80 to 120 nm. After this deposition, there is into the polysilicon film introduced by the thermal diffusion method an n-type impurity such as P for reducing the resistance. Subsequently, a not-shown etching mask (of a photoresist film) is formed over the aforementioned polysilicon film all over the surface of the memory cell forming region excepting the connected regions between one n-type semiconductor region 29 of the memory cell selecting MOS.FET Qs and a laterdescribed complementary data line.

Figure 14:
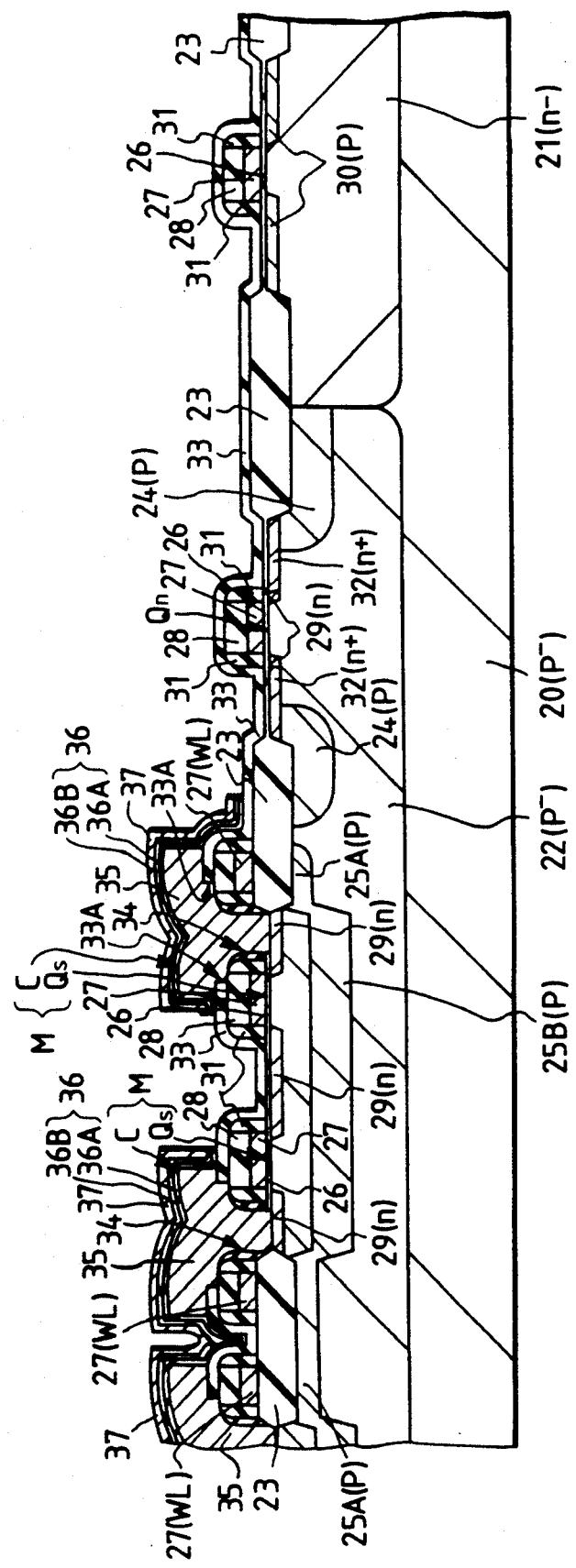

After this, as shown in FIG. 14, the aforementioned etching mask is used to anisotropically etch the aforementioned polysilicon film and dielectric film 36 sequentially thereby to form an upper electrode layer 37 of the information storing capacity element C. By forming this upper electrode layer 37, the information storing capacity element C of the so-called "stacked structure" is substantially completed to complete the memory cell M of the DRAM. After this memory M has been completed, the aforementioned etching mask is removed.

Figure 15:
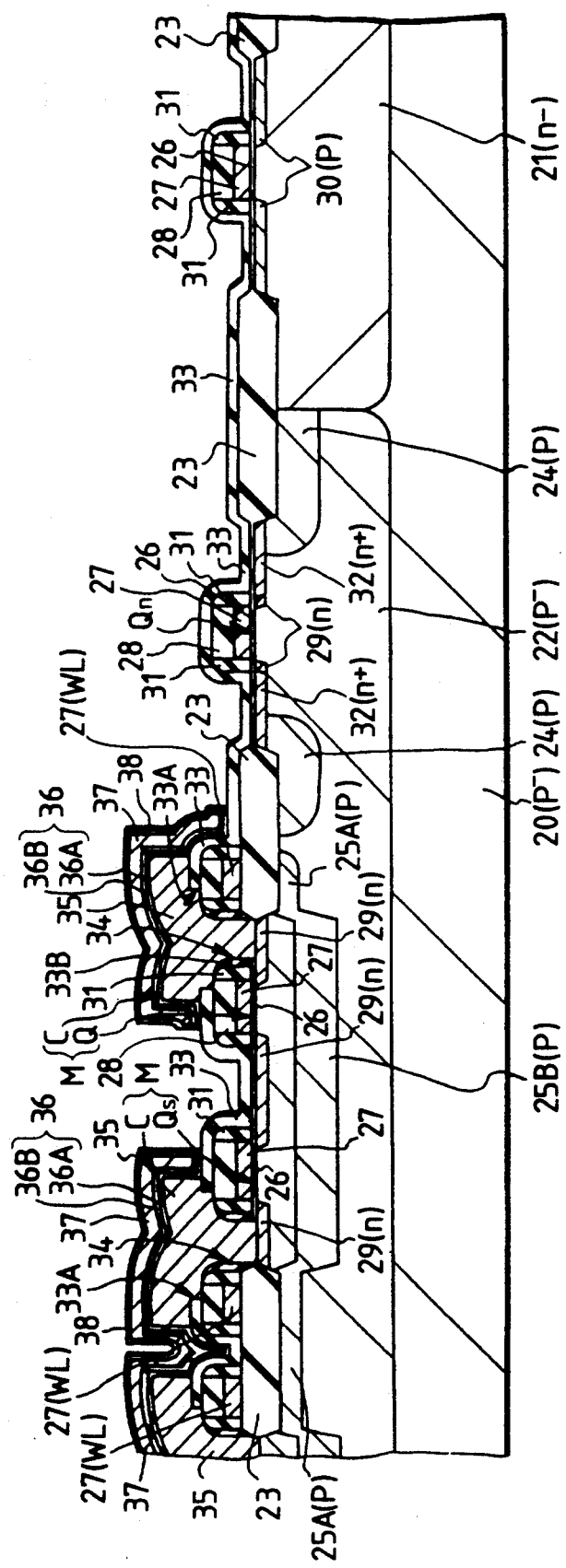
Figure 16:
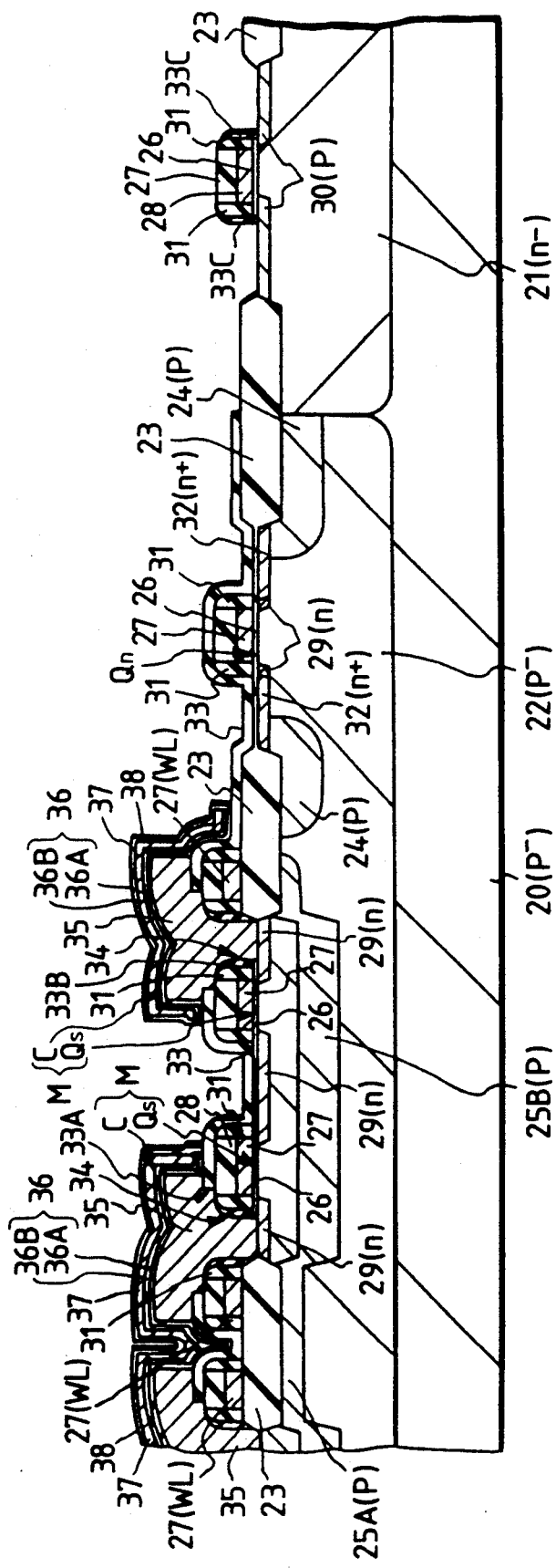

Next, as shown in FIG. 15, the substrate 20 is thermally oxidized to form an insulating film (e.g., SiO2 film) 38 over the surface of the upper electrode layer 37 of the aforementioned information storing capacity element C. This insulating film 38 is formed at the step of oxidizing the residual (e.g., polysilicon film) left unetched on the underlying surface (i.e., the surface of the inter-layer insulating film 3) when the aforementioned upper electrode layer 37 is patterned.

Next, the inter-layer insulating film 33 formed at the aforementioned step is anisotropically etched in the region for forming the aforementioned p-channel MIS-FET Qp of the peripheral circuit, to form a side wall spacer 33C on the side wall of the aforementioned side wall spacer 31. This side wall spacer 33C is formed in self-alignment with the gate electrode 27 of the p-channel MOS.FET Qp. The side wall spacer 33C is formed to elongate the side wall spacer 31 of the p-channel MOS.FET Qp in the direction of the gate length. The total gate length size of the side wall spacers 31 and 33 is about 200 nm.

Next, a not-shown insulating film is deposited all over the surface of the substrate 20. This insulating film is used to act as a film for preventing the contamination mainly when an impurity is to be introduced. This insulating film is formed of a SiO2 film, which is deposited by the CVD method using the inorganic silane gases and the nitrogen oxide gases as the source gases, to have a small thickness of about 10 nm.

Figure 17:
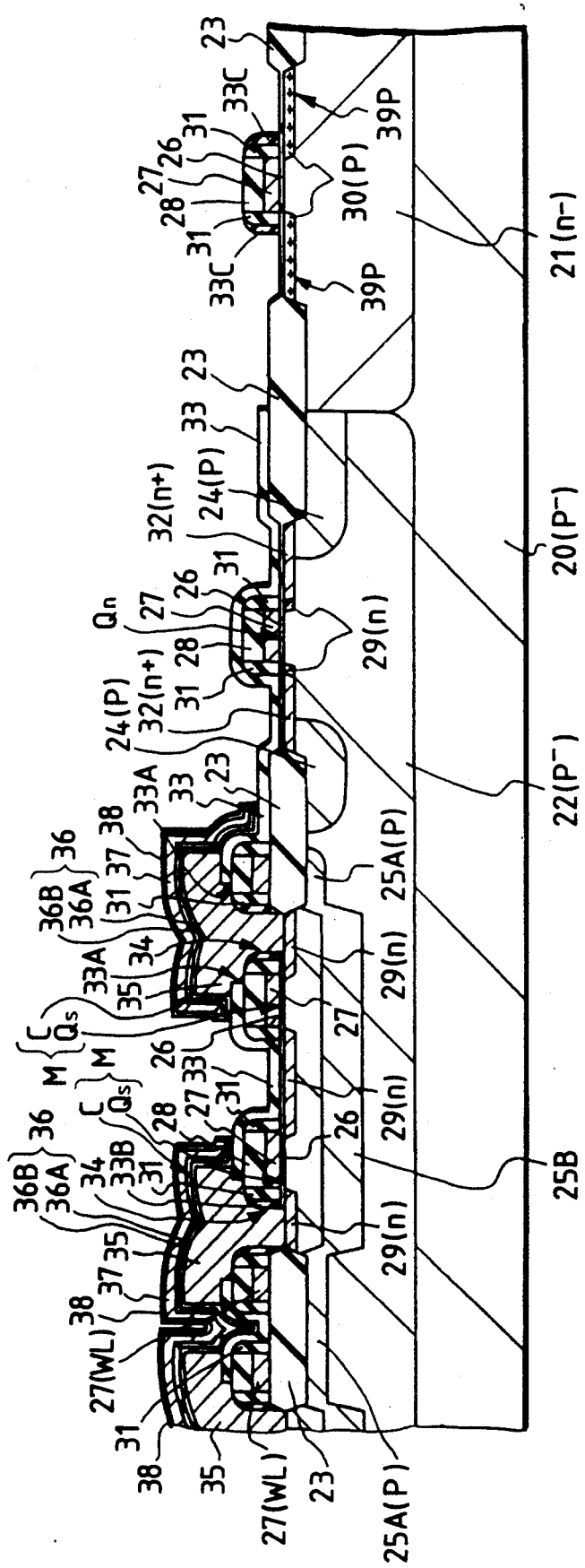

Next, the aforementioned high current type ion implanting apparatus 1 is used in the present embodiment to introduce a p-type impurity 39p into the region for forming the p-channel MOS.FET Qp of the peripheral circuit, as shown in FIG. 17. Upon the introduction of the p-type impurity 39p, the side wall spacers 31 and 33c are mainly used as the impurity introduction mask. On the other hand, the regions other than the region for forming the p-channel MOS.FET Qp are covered with a not-shown impurity introduction mask (of a photoresist film). The aforementioned p-type impurity 39p used is $BF_2$ (or B) in an impurity concentration of about $10^{15}$ atoms/cm$^2$, for example, and is introduced by the ion implantation method using an energy of about 50 to 70 KeV. At this time, the ion implantation is carried out for about 10 minutes while turning the rotating disc 13 of the ion implanting apparatus 1 at a speed of 1,000 r.p.m.

Figure 18:
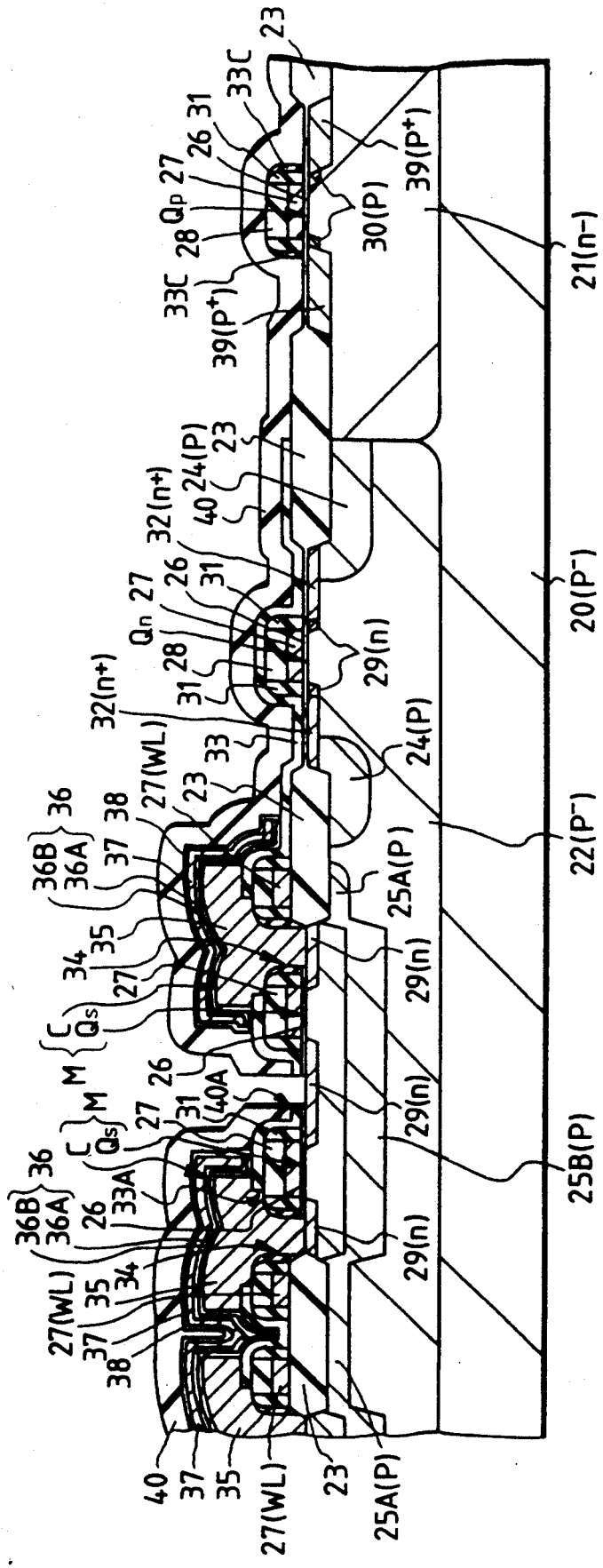

After this, the substrate 20 is heated, as shown in FIG. 18, to extend and diffuse the aforementioned p-type impurity 39p thereby to form a p$^+$-type semiconductor region 39. This heat treatment is accomplished at a high temperature of about 900° to 1,000° C., for example, for 20 to 40 min. By forming the aforementioned p$^+$-type semiconductor region 39, there is completed the p-channel MOS.FET Qp of the peripheral circuit, which has the LDD structure.

Thus, in the DRAM fabricating process of the present embodiment, the aforementioned ion implanting apparatus 1 is used at the step of ion-implanting the substrate 20 with an impurity in a high concentration of about $10^{15}$ atoms/cm$^2$, i.e., the step of forming the n$^+$-type semiconductor region 32 of the n-channel MOS.-FET Qn of the peripheral circuit and the p$^+$-type semiconductor region 39 of the p-channel MOS.FET Qp of the peripheral circuit so that the substrate 20 can be less contaminated by the sputtering of the ion implanting apparatus 1. As a result, the defects induced in the substrate 20 at the time of the ion implantation can be efficiently removed by the subsequent cold (at about 900° to 1,000° C.) heat treatment so that the electric characteristics of the MOS.FETs Qn and Qp can be prevented from being deteriorated by those defects, to improve the production yield of the DRAM.

Although our invention has been specifically described hereinbefore in connection with its embodiment, it should not be limited to the foregoing embodiment but can naturally be modified in various manners without departing from the gist thereof.

In the foregoing embodiment, the description has been directed to the case in which the present invention is applied to the high current type ion implanting apparatus to be used at the step of introducing an impurity in a high concentration of about $10^{15}$ atoms/cm$^2$ into the substrate 20, but the invention should not be limited thereto. For example, however, the invention can also be applied to a medium current type ion implanting apparatus to be used at the step of introducing an impurity in a medium concentration of about $10^{12}$ to $10^{13}$ atoms/cm$^2$ like the case in which the well region or the channel stopper region is to be formed.

The effects to be obtainable from the representative example of the invention to be disclosed in the present embodiment will be briefly described in the following.

Thanks to the structure of the ion implanting apparatus in which at least the surfaces of the members disposed on the passage of the ion beam are made of highly pure silicon, the substrate can be effectively prevented from being contaminated by the sputtering of the ion implanting apparatus, and the defects induced in the substrate at the time of the ion implantation can be efficiently removed by the subsequent heat treatment, so that the electric characteristics of the elements can be prevented from being deteriorated by those defects to improve the production yield of the semiconductor integrated circuit device.

Embodiment 2

First of all, the outline of the Embodiment 2 of the present invention will be described with reference to FIGS. 19 to 21.

FIG. 19 is a schematic diagram showing the overall structure of the present ion implanting apparatus. FIG. 19 shows the high current type ion implanting apparatus for the batch treatment, but a sheet type apparatus has a similar structure.

(1) A wafer cooling mechanism circulates a coolant 217, which is cooled down by a refrigerator 215, to a rotating stage 218 carrying wafers 213 to cool down the wafers 213 to a temperature within a range of 0° to −100° C. (further to about −200° C.). On the other hand, the coolant can be replaced by helium gases so that the refrigerator 215 is used as a helium compressor to cool down the rotating stage 218 by the adiabatic expansion of the helium. In order to drop the thermal resistance between the wafer 213 and the rotating stage 218, auxiliary cooling gases 219 are confined in the gap between the wafer 213 and the rotating stage 218.

(2) An electronic shower monitor 211 of an electronic shower generator 210 and an ion source power source 201 or an extraction electrode power source 204 are electrically associated so that an ion beam 221 is stopped to prevent the dielectric breakdown of the wafer 213 by disconnecting the ion source power source 201 or the extraction electrode power source 204 at an instant when the electronic shower drops to a predetermined level or lower.

(3) In order to improve the purity of multivalent ions and molecular ions, a beam filtering slit electrode 206 is disposed at the exit of a mass analyzing unit 205 to filter the energy contaminants which are produced from an ion source 202 to the exit of the mass analyzing unit 205. In a method to be used for this filtration, a voltage of 50% or more of the extraction voltage is applied to the beam filtering slit electrode 206. In order to prevent the energy contamination ions which might otherwise be produced between the exit of the mass analyzing unit 205 to the exit of a downstream step acceleration tube 208, this region is evacuated by providing mechanical dry (or oil-free) evacuation systems 207 and 209.

Figure 20A:
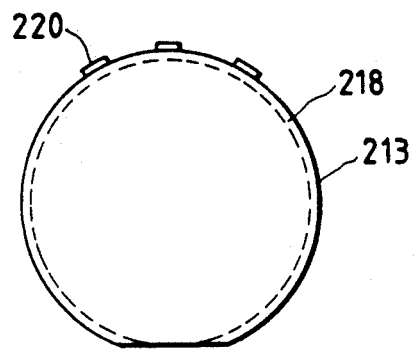
FIG. 20 presents a front elevation at (A) and a side elevation at (B) showing a wafer holding portion of the ion implanting apparatus.
Figure 20B:
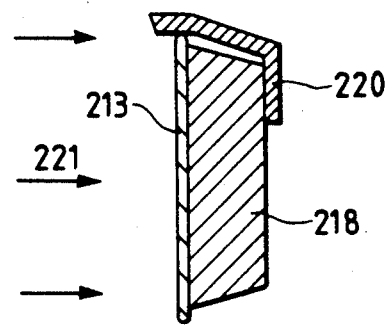
Figure 21A:
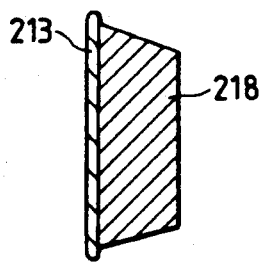
FIG. 21 shows another example of the wafer holding portion of the ion implanting apparatus and presents the state at (A), in which the wafer is held without any stopper by the electrostatic chucking method, a diagram at (B), in which the wafer stopper has its shape improved, and a diagram at (C) showing another example of the stopper.
Figure 21B:
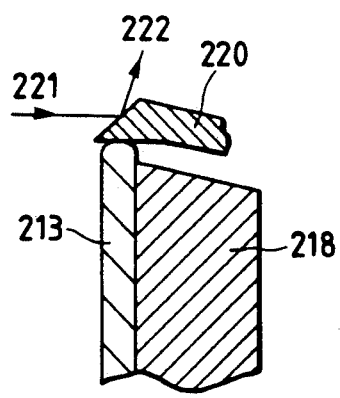
Figure 21C:
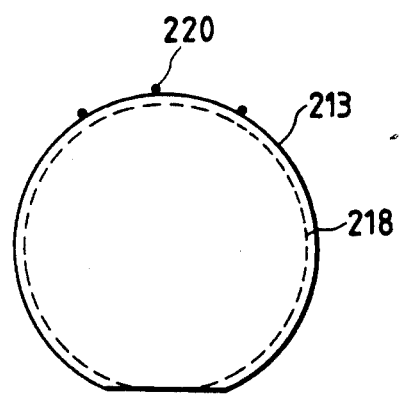

(4) FIG. 20 shows a holding portion of the wafer 213. FIG. 20 presents a front elevation at (A) and a side elevation at (B). As seen from (B) of FIG. 20, the ion beam 221 impinges upon a wafer stopper 220 so that the aluminum making the stopper 220 or the impurity contained in the same is produced by the sputtering until it sticks to the wafer 213. This is prevented, as shown in FIG. 21. FIG. 21 (A) shows the case in which the wafer holding is accomplished by an electrostatic chuck mechanism so that no metal may be placed around the wafer 213. FIG. 21(B) shows the case in which the wafer stopper 220 is counter-tapered so that a sputter substance (e.g., secondary ion beam) 222 may be reluctant to fly to the wafer 213 even if the wafer stopper 220 is hit by the ion beam 221. FIG. 21 (C) shows the case in which the wafer stopper 220 is formed into a needle shape having the minimum area for the ion beam 221 so that the secondary ion beam 222 may be prevented from being produced.

Moreover, the wafer stopper 220 itself is made of a material identical to that of the electrode in the aforementioned beam passage so that the troubles due to the sputtering can be prevented.

Thanks to the structures thus far described, the following effects can be attained:

Since the extensions and the incomplete removal of the defects caused during the ion implantation can be suppressed by cooling the wafers, the implanted layer obtained can be freed from the crystal defects due to the cold annealing to realize a deep sub-micron device. Since, moreover, the electronic shower and the ion source power supply are electrically associated, the dielectric breakdown of the wafers can be eliminated even when the electronic shower generator is troubled. Since, still moreover, the wafers can be prevented from being contaminated with the metal to reduce the junction leakage current and to prevent the crystal defects by improving the impurity and shape of the wafer holding unit, it is possible to improve the yield of the deep sub-micron device. Thanks to the improvement in the vacuum from the beam filter and the mass analysis tube to the downstream step acceleration tube, furthermore, the energy contamination of the multivalent or molecular ion implantation can be prevented to prevent the dispersion in the device characteristics and to improve the production yield.

Furthermore, the electrode or slit on the ion beam passage is made of a conductive Si member so that the contamination due to the undesired sputtering action can be drastically reduced even with a high current implantation.

Since, furthermore, the beam after the mass analysis is not deflected but introduced at right angles into the wafer surface along the shortest passage, it is possible to retain a high throughput and a fine workability.

Next, the details of the individual portions of the present ion implanting apparatus will be described with reference to FIGS. 19 to 21. The numeral 201 designates an ion source power supply for supplying an electric current to the filament of the ion source 202 and the electronic shower generator 210. The numeral 202 designates an ion source such as the Freeman source. Numeral 203 designates an oil-free evacuation system having a series connection of a rough suction dry pump and a turbo molecular pump such as the SD series dry pump from Kashiyama Industry Co., Ltd. and KDM series molecular drag pump for exhausing the gases discharged from the ion source 202. The numeral 204 designates the extraction out electrode power source which is turned off to 0 V by the action of the electronic shower monitor 211, when the electronic shower generator 210 is troubled, to interrupt the extraction of the ions. The numeral 205 designates a mass analysis unit (or mass analysis tube) having an analysis magent 205' for selecting the desired ones of the extracted ions. The numeral 206 designates a beam filtering slit electrode disposed at the exit of the mass analysis unit 205. The slit electrode 205 is formed at the center of a disc of a doped single crystalline Si like another slit electrode with an aperture for allowing the ion beam 221 to pass therethrough, and its plate is supplied with a predetermined voltage, as has been or will be described. The beam filtering slit electrode 206 selects only the desired ions in a high purity, when the multivalent or molecular ions are to be implanted, by applying a voltage of 50% or more of the extraction voltage Vo to the slit electrode 206. Numeral 206' designates a similar slit electrode for allowing only the ions that have been carried to a predetermined position by the action of the analysis magnet 205', to pass therethrough. The numeral 207 designates a mechanical dry evacuation system having a structure similar to that of the oil-free evacuation system 203. The numeral 208 designates a downstream step acceleration unit (or downstream step acceleration tube) including five to ten slit electrodes similar to the aforementioned ones. The numeral 209 designates a mechanical dry evacuation system similar to the system 207. The numeral 210 designates an electronic shower generator for adding electrons to the ion beam 221 so as to prevent the wafers 213 from being broken due to the charge-up, as has been or will be described. The numeral 211 designates an electronic shower monitor for preventing the charge-up on the wafers 213 by monitoring the current of the electronic shower generator 210 and by interrupting the ion discharge from the ion source 202 when the current drops to a level lower by a predetermined value from the set level. Numeral 212 designates an implantation chamber for accommodating a number of wafers 213 to implanting them with the ions. The numeral 213 designates the wafers, i.e., the Si wafers of the semiconductor integrated circuit device, which are to be implanted with the ions. Numeral 214 designates the cryo-pump evacuation system using the rough suction dry pump similar to the aforementioned one as the primary pump. Numeral 214' designates the cryo-evacuation system of the load lock chamber, which has a structure similar to the system 214. The numeral 215 designates a refrigerator for cooling (or compressing, cooling or liquidifying) the coolant 217 to cool the wafers 213 to a room temperature or, desirably, 0° to −100° C. (further to about −200° C.). Numeral 216 designates a load lock chamber in which the pressure is once adjusted to a predetermined degree of vacuum or an atmospheric pressure when the wafers 213 are to be loaded or unloaded. The numeral 217 designates a coolant such as $N_2$ gases, He gases, ethylene glycol, liquid $N_2$ or liquid He. The numeral 218 designates a rotating stage which accommodates 20 to 30 wafers 213 and moves in parallel while rotating at a high speed. Numeral 219 designates cooling auxiliary gases which are forced into the gap between the wafers 213 and the stage 218. Numeral 220 designates a wafer stopper of doped Si for preventing the wafers from flying out. The numeral 221 designates an ion beam, and the numeral 222 designates a secondary ion beam.

The details of the individual portions will be described in the following.

Figure 22:
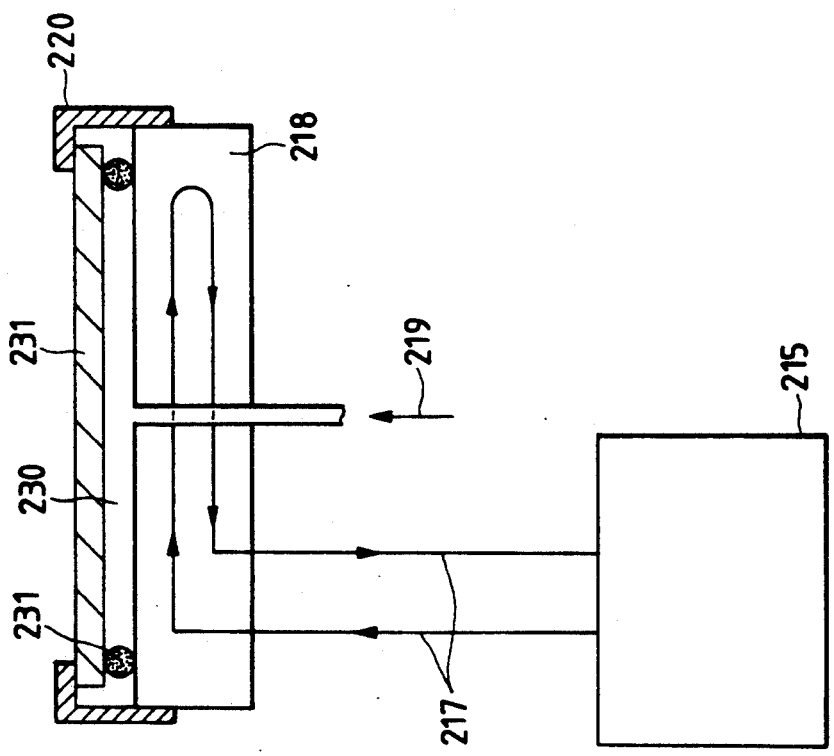
FIG. 22 is a section schematically showing the chuck portion of a rotary stage of the ion implanting apparatus.

FIG. 22 shows examples of the rotating stage and its cooling mechanism. In FIG. 22: the numeral 213 designates a wafer; the numeral 215 a refrigerator; the numeral 217 a coolant such as ethylene glycol and its circulator; the number 218 a rotating stage; the numeral 219 cooling auxiliary gases and their introduction passage for improving the heat transfer between the rotating stage 218 and the wafer 213; the numeral 220 a wafer stopper (of doped Si); numeral 230 a cooling gas introduction chamber; and numeral 231 an O-ring. By the cooling mechanism thus constructed, the temperature of the implanted surface of the wafer being implanted with a high current can be held at a temperature from the room temperature to about 0° C. or a lower temperature.

Figure 23:
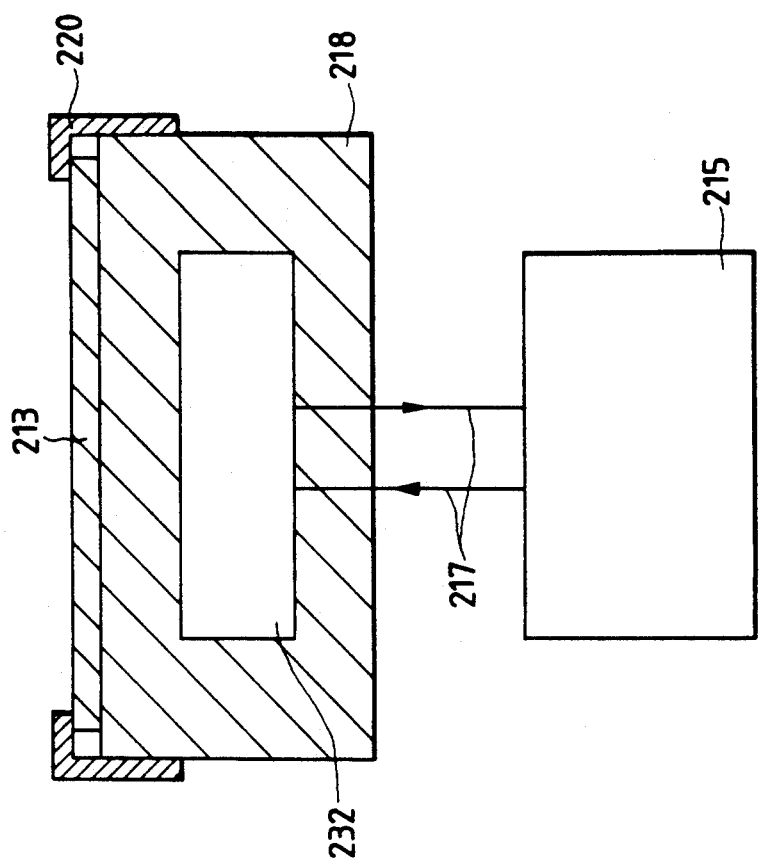
FIG. 23 is a section schematically showing another example of the rotary stage of the ion implanting apparatus.

FIG. 23 shows other examples of the rotating stage and its cooling mechanism. In this example, the stage is cooled down to a very low temperature by the adiabatic expansions of He (helium) like the cryo-pump, and the stage and the wafer are held in close contact to improve the cooling efficiency. In FIG. 23: the reference numeral 213 designates a wafer; the numeral 215 an He compressor; the numeral 217 He and its passage; the numeral 218 a cooling stage; the numeral 220 a wafer stopper of doped Si; and numeral 232 a He adiabatic expansion chamber.

Figure 24:
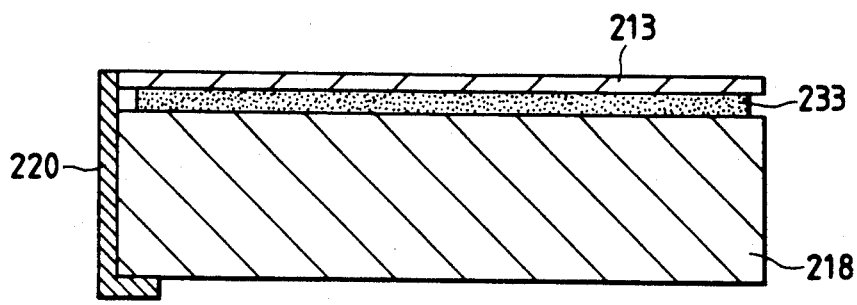
FIG. 24 is a section schematically showing still another example of the rotary stage of the ion implanting apparatus.

FIG. 24 shows still another example of the rotating stage. This example is directed to the so-called "electrostatic chuck", by which the wafer is attracted through an insulating sheet to the stage. In FIG. 24, the reference numeral 213 designates a wafer, and the numeral 218 designates a wafer cooling stage having a cooling mechanism using the existing coolant, $N_2$ or He, as has been described hereinbefore. The numeral 220 designates a wafer stopper of insulating Si, and numeral 233 designates silicon rubber (or elastomer).

Figure 25:
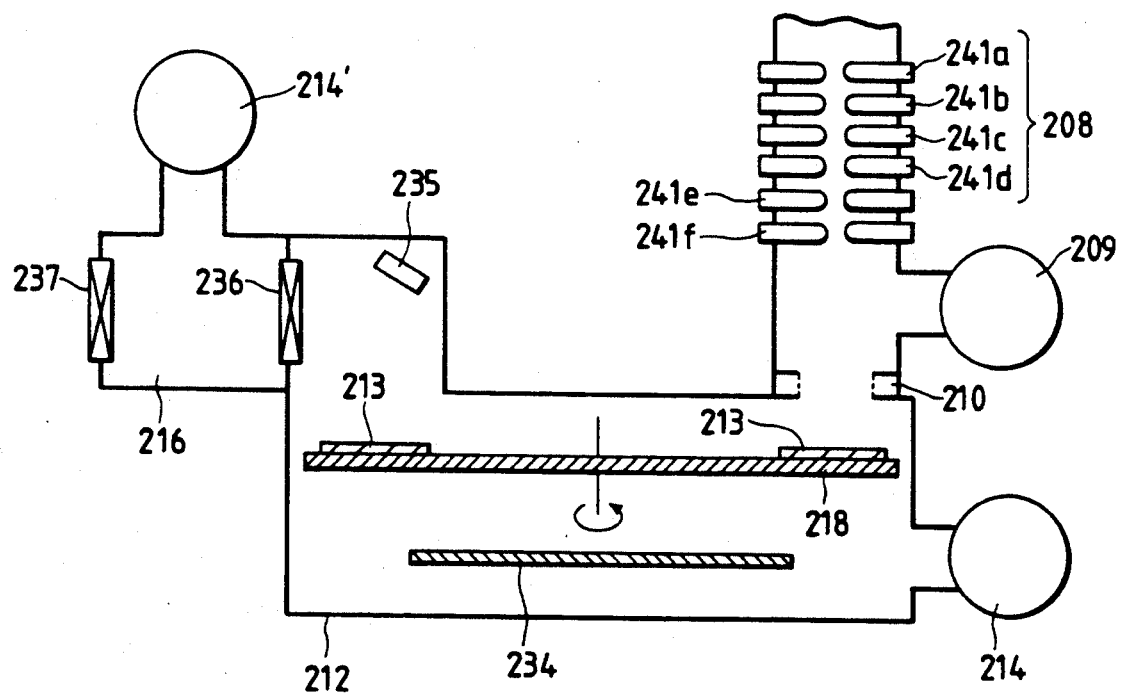
FIG. 25 is a section schematically showing the detailed structure of the implantation chamber and its vicinity of the ion implanting apparatus.

FIG. 25 shows the detail of the downstream step acceleration tube and the implantation chamber of the whole apparatus shown in FIG. 19. In FIG. 25, the reference numeral 208 designates a downstream step acceleration tube, and the numeral 209 designates an evacuation system having a rough suction dry pump and a turbo molecular pump to raise the degree of vacuum in the ion passage just before the implantation. The numeral 212 designates an ion implantation chamber held at the ground potential of the system. The numeral 214 designates the cryo-pump evacuation system. The numeral 214' designates the cryo-evacuation system of the load lock chamber, in which the degree of vacuum is raised to a predetermined vacuum level by the rough suction dry pump and then to a vacuum level substantially equal to that of the main implantation chamber by the cryo-pump until the wafer is introduced into the implantation chamber. The numeral 216 designates a load lock chamber which has its degree of vacuum raised from the atmospheric level substantially to the implantation level, when the wafer is introduced, by the evacuation of the rough suction and cryo-pumps. Upon the discharge of the wafer, on the other hand, the wafer is heated in its entirety to 10° C. or higher by blowing dry and hot $N_2$ gases to the cold wafer so that it may be prevented from being wetted by the moisture condensation. The reference numeral 218 designates a rotating stage. Numeral 234 designates a wafer surface condensation preventing shroud which has a metal surface held at a temperature lower by 20° to 50° C. than the wafer surface. Numeral 235 designates a wafer heating halogen lamp for heating the wafer either by itself or together with the preceding hot $N_2$ gases to prevent the condensation of the wafer being discharged. Numeral 236 designates an automatic door for partitioning the implantation chamber and the load lock chamber. Numeral 237 designates an automatic door for partitioning the load lock chamber and the outside (or the atmosphere). Numerals 241a to 241f designate a group of acceleration electrodes which are made of a disc-shaped single crystalline doped Si having a square aperture at its center.

Figure 26:
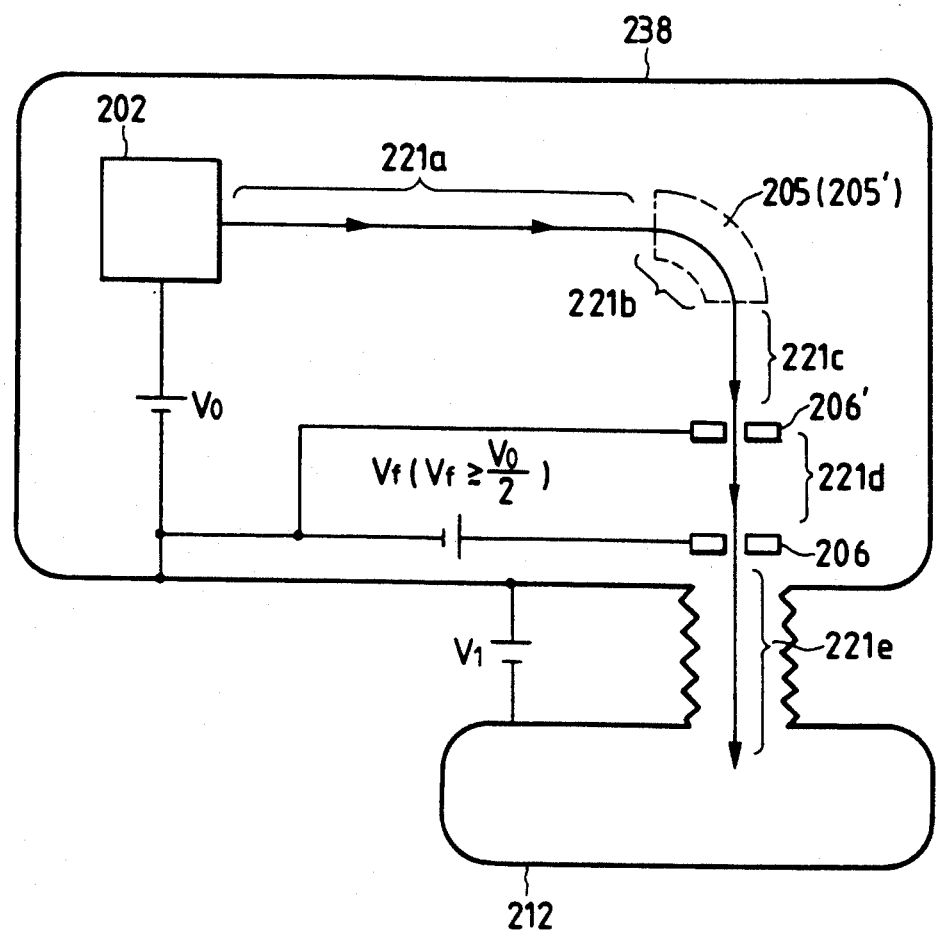
FIG. 26 is a section schematically showing the potential relations of the individual portions of the ion implanting apparatus.

FIG. 26 shows a potential arrangement in the ion implanting apparatus. In FIG. 26: the numeral 202 designates an ion source; the numeral 205 a mass analysis tube; the numeral 205' an analysis magnet; the numeral 206 a beam filter slit electrode; the numeral 206' an analyzer electrode; and the numeral 212 an implantation chamber earthed to the ground potential. Numerals 221a to 221e designate ion beam passages, of which: the passage 221a is an analyzer front passage; the passage 221b is an analyzer central passage; the passage 221c is an analyzer rear passage; the passage 221d is an inter-filter passage; and the passage 221e is an acceleration tube passage. Numeral 238 designates a high voltage chamber (the voltage of which is called the "high voltage terminal" or the "high voltage ground"). Letter $V_1$ designate a downstream step acceleration voltage; letter $V_0$ designates an extraction voltage (e.g., 20 to 30 KV) of the ion source; and letter $V_f$ designates a filter voltage for blocking the monovalent ions which might otherwise be mixed upon the multivalent ion implantation, and the filter voltage is slightly higher than the half of the extraction voltage when divalent ions are implanted.

Figure 27:
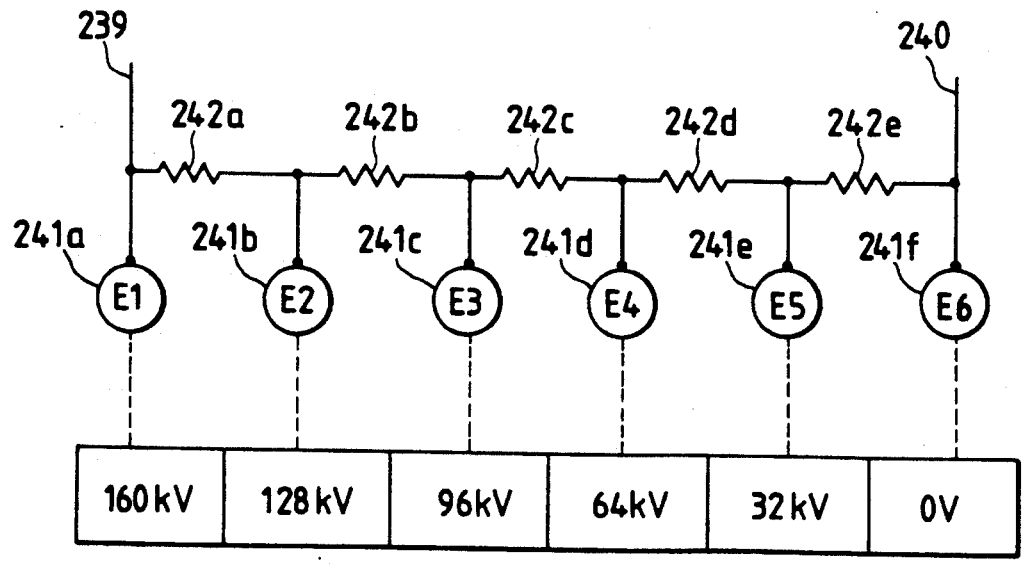
FIG. 27 is a circuit diagram showing a downstream stage acceleration electrode of the ion implanting apparatus.

FIG. 27 shows a potential distribution to the group of downstream step acceleration electrodes. In FIG. 27: letters E1 to E6 designate the potentials of the individual electrodes; numeral 239 designates a $V_1$ potential; numeral 240 a ground potential; numerals 241a to 241f a group of acceleration electrodes; and numerals 242a to 242e dividing resistors.

Figure 28:
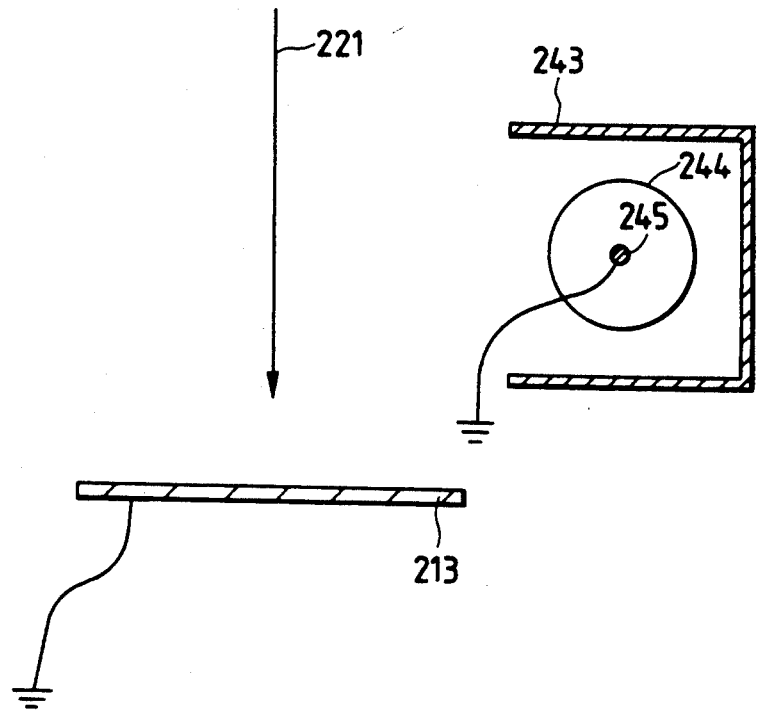
FIG. 28 is a section schematically showing the electronic shower portion of the ion implanting apparatus.

FIG. 28 shows the relation between the wafer and the electronic shower. In FIG. 28, the numeral 213 designates a wafer which is generally earthed to the ground potential. The numeral 221 designates an ion beam; numeral 243 the plate (at the same potential as the cathode) of the electronic shower generator; numeral 244 a grid of the same; and numeral 245 a cathode of the same. The electrons at a high energy (e.g., 200 to 300 eV) extracted from the cathode 245 by the grid voltage react with the Ar gases in the electronic shower to emit many electrons at a low energy (about 10 eV).

Figure 29:
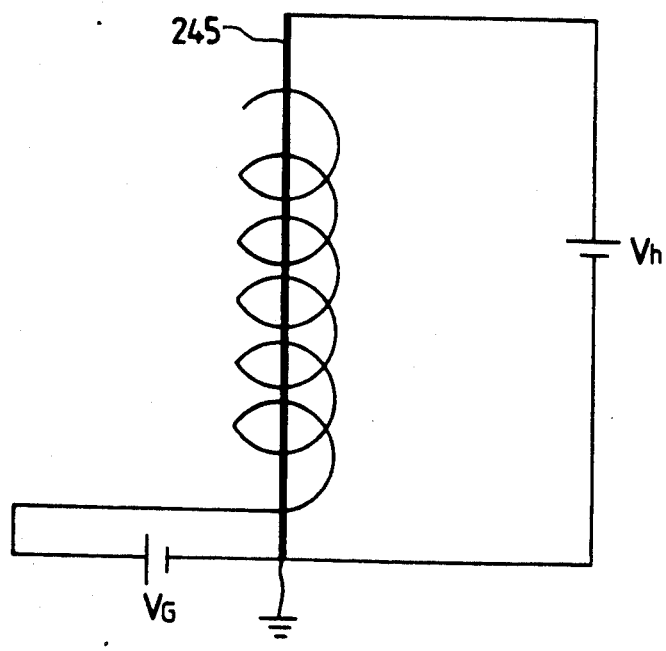
FIG. 29 is a circuit diagram showing the electronic shower portion shown in FIG. 28.

FIG. 29 is a schematic circuit diagram showing the electronic shower generator. In FIG. 29: reference letters $V_h$ designate a cathode (or filament) voltage; letters $V_G$ designate a grid voltage; the numeral 244 designates a grid; and the numeral 245 designates a cathode (or filament).

Figure 30:
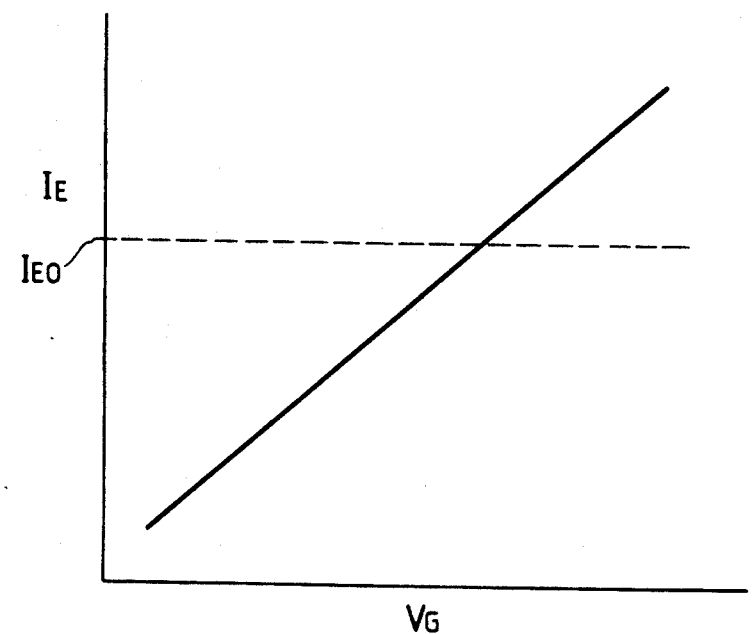
FIG. 30 is a graph plotting the relation between the emission current and the gate voltage of the electronic shower shown in FIG. 28.

FIG. 30 plots the relation between an emission current $I_E$ from the cathode and the grid voltage $V_G$. In FIG. 30, letters $I_{EO}$ designate an initial set value of the emission current.

Figure 31:
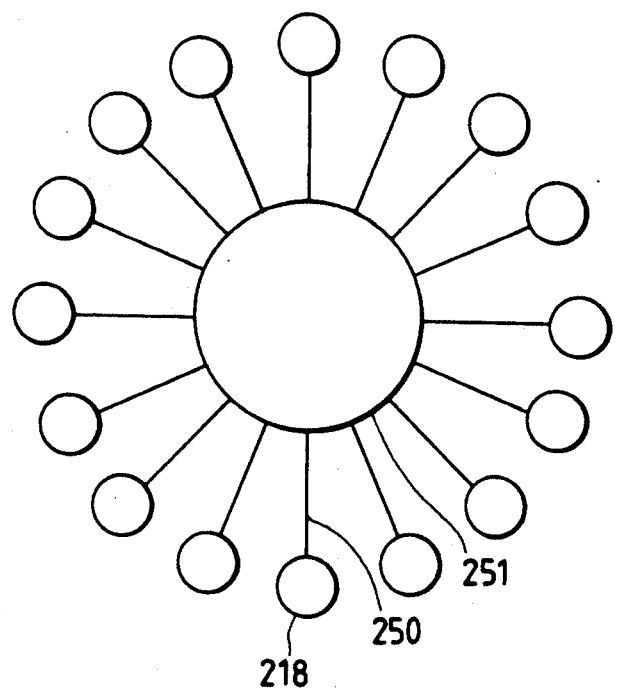
FIG. 31 is a front elevation showing the whole structure of a wafer bed rotary stage in the implantation chamber of the ion implanting apparatus.

FIG. 31 is a diagram showing the whole structure of the rotating stages. In FIG. 31, the rotating stages 218 are usually provided in a number equal to or slightly more than a single lot of wafers, i.e., ten to twenty five wafers so as to treat all of the wafers at one time. Numeral 250 designates support columns, and numeral 251 designates a central rotor portion.

Figure 32:
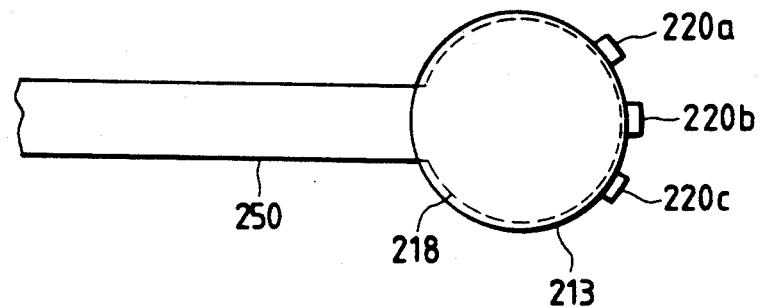
FIG. 32 is an enlarged front elevation showing a wafer bed in the leading end portion of the rotary stage shown in FIG. 31.

FIG. 32 is a wafer principal surface (taken in a top plan view) showing the state, in which a wafer is placed on one of the rotating stages. In FIG. 32, the wafer 213 has its peripheral end portion positioned outside of the bottom of the rotating stage 218 and held by wafer stoppers 220a to 220c. Moreover, the support columns 250 are formed with not-shown coolant passages.

Figure 33:
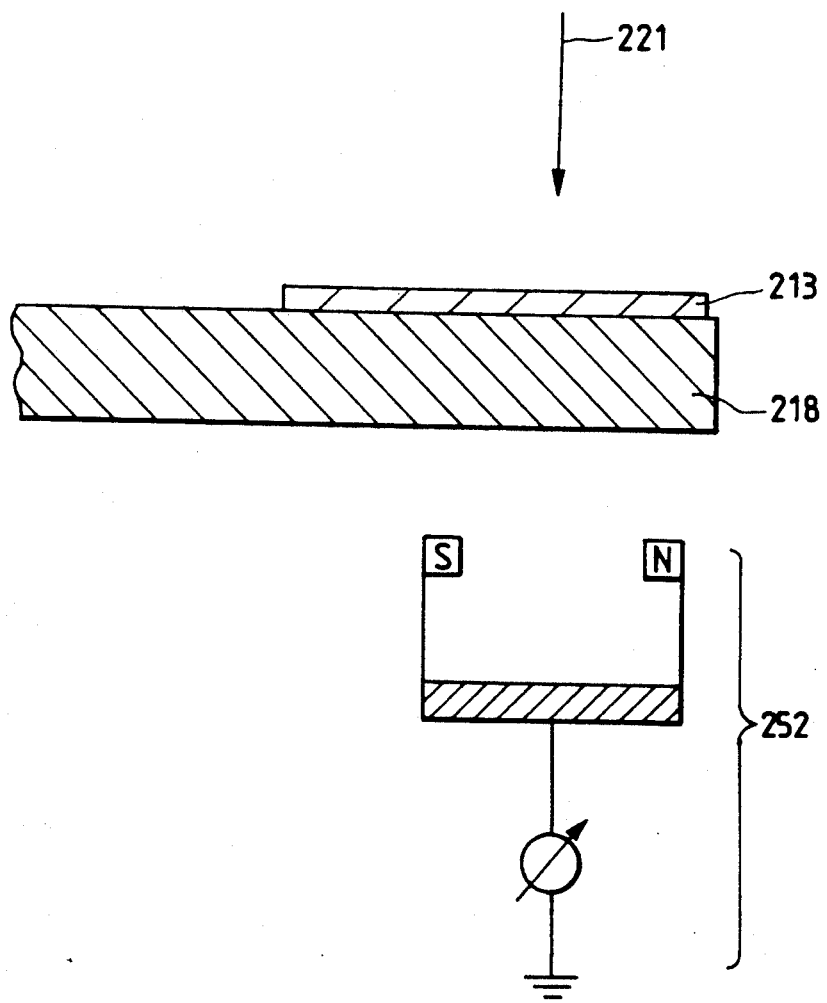
FIG. 33 is a section schematically showing the leading end portion of the rotary stage shown in FIG. 31.

FIG. 33 shows the relation between the wafer and the Faraday cup. This Faraday cut 252 is constructed to include an ion collecting cup (with transverse magnetic fields) and an ammeter having its one terminal earthed to the ground.

FIG. 34 shows examples of the undesired reactions caused in the ion passage. In FIG. 34, letter A designates residual gas molecules. The shown examples are effected when divalent ions of phosphor (P) are implanted.

Figure 35:
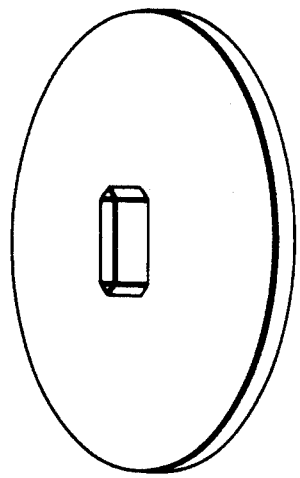
FIG. 35 is a perspective view showing an electrode structure which can be used as a lead-out electrode, deceleration electrode, analyzer slit, beam filter or downstream stage acceleration electrode group arranged along the ion beam passage of the ion implanting apparatus.

FIG. 35 is a perspective view showing a slit electrode plate made of doped Si single crystal. In FIG. 35, numeral 253 designates an electrode plate, and numeral 254 designates a square aperture corresponding the square ion beam of the Freeman source. This shape is generally resembled by the extraction electrode of the ion source, the mass analyzer (or mass analysis slit) electrode 206', the beam filtering slit electrode 206 and the grouped downstream acceleration electrodes 241a to 241f.

Figure 36:
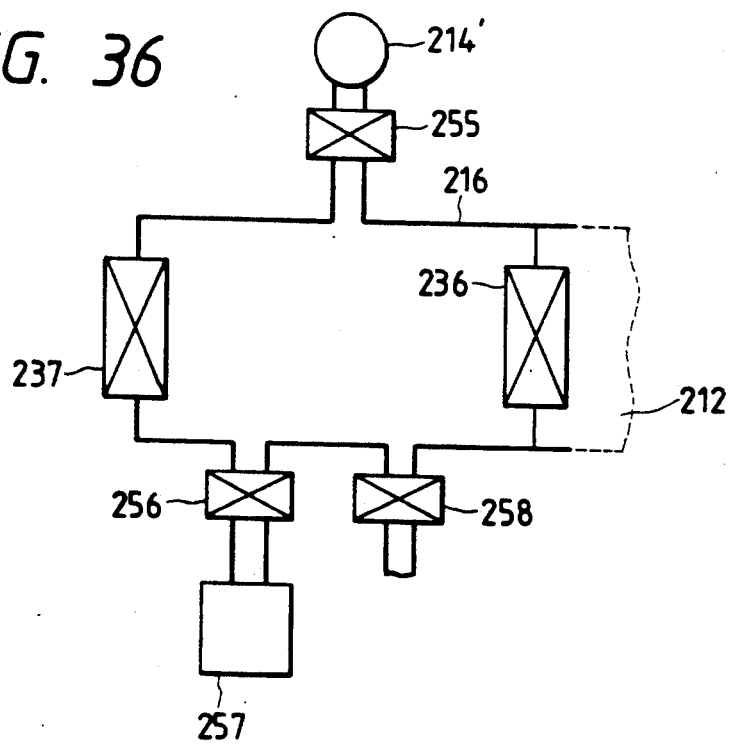
FIG. 36 is a section schematically showing the detail of a load lock chamber and a condensation preventing device of the ion implanting apparatus.

FIG. 36 shows the detail structure of the load lock chamber 216. In FIG. 36: the numeral 212 designates an implantation chamber; the numeral 214' the cryo-evacuation system; the numeral 236 an automatic door between the load lock chamber and the implantation chamber; and the numeral 237 an automatic door between the load lock chamber and the outside. Through these components, the wafers are loaded and unloaded. Numeral 255 designates a control valve for separating the cryo-evacuation system 214' from the load lock chamber 216. Numeral 256 designates a control valve for establishing the communication between a hot $N_2$ supply 257 for heating the wafers to about 10° C. and the load lock chamber 216. Numeral 258 designates a control valve for discharging the hot $N_2$ gases from the load lock chamber 216.

FIG. 37 presents at (a) to (c) schematic diagrams showing the wafers in the load lock chamber and the motions of a wafer cassette. In FIG. 37: numeral 260b designates a first wafer cassette; numeral 260a a second wafer cassette; the numeral 213b the wafers belonging to a first wafer group (or lot); and the numeral 213a the wafers belonging to a second wafer group.

Figure 38:
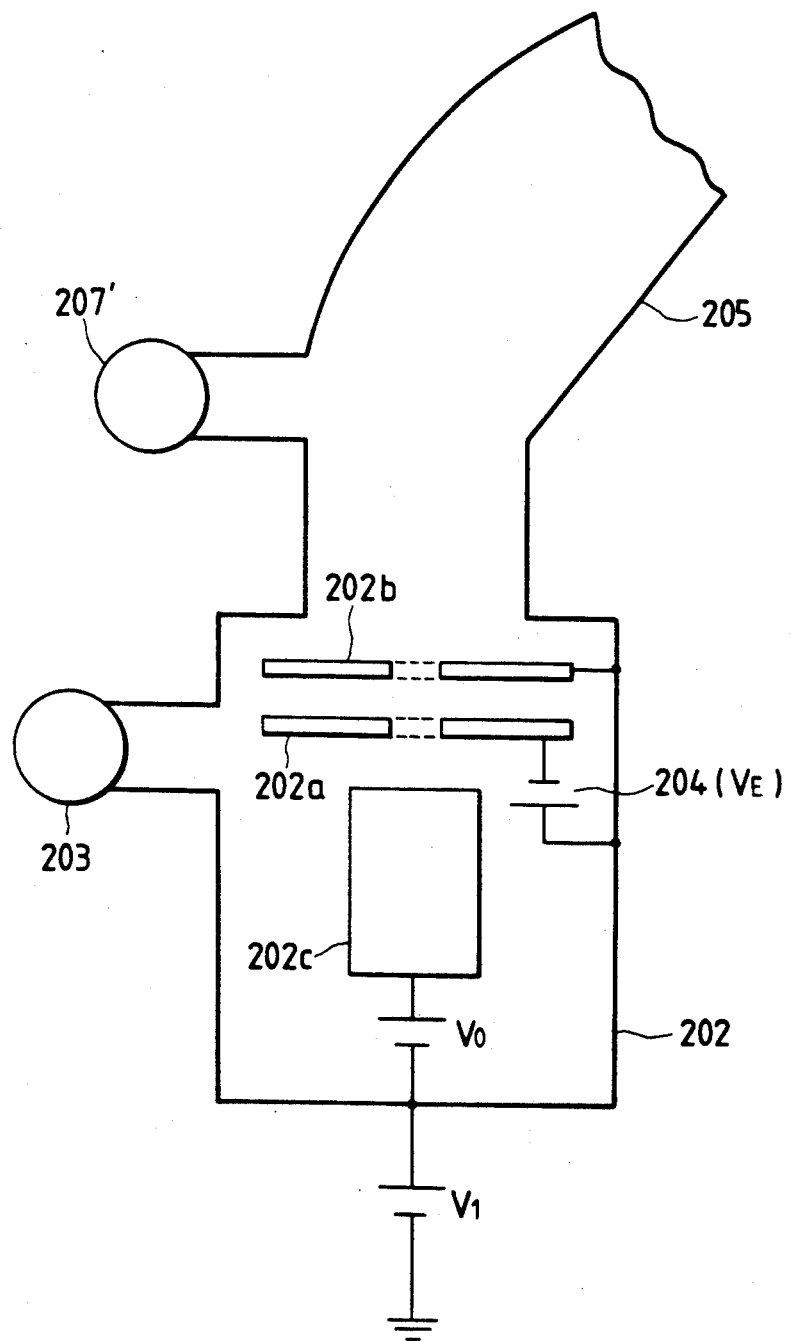
FIG. 38 is a section showing the detailed structures of the ion source and its vicinity of the ion implanting apparatus and the potential relations of the individual portions.

FIG. 38 is an enlarged schematic section showing the detail of the ion source and its vicinity. In FIG. 38: the numeral 202 designates the housing of the ion source; numeral 202a an extraction acceleration electrode ($V_E$ = −2 to 30 KV); numeral 202b a deceleration electrode (or a ground electrode); numeral 202c an ion source body (or an arc chamber or ion generation chamber); the numeral 203 an evacuation system; the numeral 204 (at $V_E$) an extraction electrode power source or acceleration voltage; the numeral 205 a mass analysis tube; the numeral 207' an evacuation system; the letter $V_0$ an ion extraction voltage (i.e., an voltage to be applied to the arc chamber) and the letter $V_1$ a downstream step acceleration voltage. Here: the voltage $V_0$ generally takes 20 to 30 KV; the voltage $V_E$ takes −2 to 30 KV; and the deceleration electrode 202b takes the high ground potential of the high pressure container, i.e, the downstream step acceleration potential $V_1$. Incidentally, the electrodes 202a and 202b are totally called the extraction electrodes or extraction electrode group.

Thus, the structures of the individual portions have been described, and the operations will be described in the following with reference to FIGS. 19 to 38.

The ion beam 221 and the ion implantation chamber 212 of the ion implanting apparatus of FIG. 19 are always evacuated to about $5 \times 10^{-7}$ (i.e., in the standby state) in the operations other than the remedy. In this state, the wafers to be treated are replaced.

The twenty five (i.e., one lot) wafers are replaced at the unit of the cassette, as shown in FIG. 36 and at (a) to (c) in FIG. 37. FIG. 37 shows at (a) that the wafer 213a belonging to a new lot is introduced after the end of the loading of the wafer 213b into the load lock chamber 216 by the automatic door 237. After this, as shown at (b) in FIG. 37, the control valve 255 is opened with the automatic doors 236 and 237 and the control valves 256 and 258 being closed, till the time (i.e., the loading time and the unloading time=each 2 minutes, and the implantation time=about 5 min.) the ion implantation of the wafer group 213b is completed, so that an evacuation is accomplished to $5 \times 10^{-5}$ to $5 \times 10^{-7}$ Torrs in the order of the rough dry suction and the cryo-pump by the evacuation system 214'. When the ion implantation of the wafer group 213b is completed, the wafer group 213b is accommodated in the first cassette 260b through the automatic control door 236. On the other hand, the wafer group 213a is set on the rotating stage 218 in the implantation chamber 212. When the setting of the wafer group 213a is completed, the automatic control valve 236 is closed whereas the control valve 256 is opened, so that the $N_2$ gas flow at a temperature no lower than 20° C. is supplied from the dry $N_2$ source to the load lock chamber 216. After the normal pressure is achieved, the gas flow is discharged from the control valve 258 so that the $N_2$ gas flow is generated in the load lock chamber 216. As a result, the wafer 213b cooled on the rotating stage 218 is heated to a temperature of 10° C. or higher. The wafer 213b thus heated is discharged to the outside through the automatic control valve 237, as shown at (c) in FIG. 37.

The wafer 213 set on the rotating stage is cooled to a temperature of 0 to −150° C. or lower in the state shown in FIGS. 19 to 25 and FIGS. 31 to 33. As a result, the temperature of the surface of the wafer to be implanted can be controlled to several tens to −120° C. In the case of the cooling to about −20° to −30° C., as shown in FIG. 22, the heat conduction is effectively improved by introducing the $N_2$, He or Ar gases into the back of the wafer 213. In the case of a lower temperature, the circulation of (liquid) nitrogen is used, as shown in FIG. 22, or the adiabatic expansions of helium are used like the cryo-pump, as shown in FIG. 23. In case the electrostatic chuck is used, as shown in FIG. 24, the elastomer (or silicon rubber) 233 has to be used for insulating the wafer 213 and the rotating stage 218. For this necessity, the coolant circulating mechanism shown in FIGS. 22 and 23 can be used although the heat efficiency (or the cooling efficiency) is slightly dropped.

When, in the run, the wafer 213 is cooled to a predetermined low temperature on the stage 218 held at the same predetermined temperature, the rotating stage 218 is started to turn, as shown in FIG. 25, and is reciprocally moved (for a period of about 10 sec.) in the direction perpendicular to the axis of rotations while maintaining the number of revolutions at 1,000 r.p.m., so that the ion beam having a section of 60 mm × 60 mm scans the whole surface of the wafer uniformly to effect the implantations for about 5 min. The monitoring of the amount of ions implanted is accomplished by receiving the beam, which passes backward from the gap of the rotating stage 218, by the Faraday cup 252, as shown in FIG. 33. On the other hand, the supply of the coolant to the vicinity of the wafer 213 is accomplished from the refrigerator 215 through the center rotor portion 251 (shown in FIG. 310 and the support column 250. This supply is accomplished during the turns of the stage 218, too, so that the surface temperature of the wafer 213 is maintained at a constant level even when a high current is implanted.

Next, the operations of the beam line will be described in the following. First of all, as shown in FIGS. 38 and 26, the body 202c of the ion source 202 is supplied with a small amount of predetermined gases or steam for producing desired ions. By the actions of the evacuation systems 203 and 207', however, the beam line from the extraction acceleration and deceleration electrode groups 202a and 202b to the mass analyzer 205 is maintained at a high vacuum of $5 \times 10^{-6}$ Torrs or more (during the ion implantations). The ions produced in the ion source body 202c are accelerated by the actions of the acceleration and deceleration electrode groups 202a and 202b to a variety of energy levels so that they fly to the mass analysis unit 205. The ions of the kind such as P++ (i.e., positive divalent ions of phosphor) to be implanted and having passed through the analyzer front passage 221a are deflected while passing through the analyzer center passage 221b until they pass through the aperture 254 (FIG. 35) of the mass analysis slit electrode 206' which is disposed at the terminal end of the analyzer rear passage 221c. The ions of the same normal kind (P++) further pass through the inter-filter passage (having a length of about 20 cm) 221d and the aperture 254 (FIG. 35) of the beam filtering slit electrode 206 for blocking the abnormal ion kind (e.g., P+) and further pass through the rear acceleration tube passage 221e (at the potential difference $V_1$), which is set for the desired ion energy, until they are implanted into the rotating wafer 213, as shown in FIG. 25.

Next, the operations of the beam filtering slit electrode 206 will be described with reference to FIGS. 26, 34 and 38.

Let the case of the implantation of the P++ be considered, for example. The $P_2^+$ discharged from the ion source 202 impinges to react with the residual gas ions A to produce P+, P and A at the analyzer front passage 221a, as shown at (a) in FIG. 34. Of these productions, the P and A are analyzed in the mass analysis unit 205 so that they do not appear at the back of the slit electrode 206'. On the contrary, the P+ is offset by the difference between the speeds of the $P_2^+$ and P++ so that it passes through the slit electrode 206' irrespective of the mass charge ratio (m/e). If these P+ ions reach the downstream step acceleration tube 208, they are implanted to cause the so-called "energy contamination" because they are accelerated only to an energy considerably lower than the desired energy level. What is provided with a view to eliminating the abnormal ion kinds before they reach the downstream step acceleration tube 208 is the beam filtering slit electrode 206. This beam filtering slit electrode 206 is positioned in the beam passage to have its principal plane intersecting the beam passage at right angles so that the normal beam may be just aligned with the center aperture 254 by the doped single crystalline Si electrode, as shown in FIG. 35. The potential $V_f$ (with reference to the voltage ground potential) of the slit electrode 206 is set at a voltage slightly higher than the half of the voltage $V_o$ in case the ions P++ are of the normal kind whereas the ions P+ (which are produced from the $P_2^+$ by the aforementioned reactions) are of the abnormal kind. As a result, the faster ions P++ can cross over the plateau of the potential, but the ions P+ (produced by the $P_2^+$) are the slower so that they can neither cross over the potential plateau nor invade to the back of the beam filtering slit electrode 206. Thus, the divalent and trivalent ion implantations, which are followed by many abnormal ion kinds, are realized in a high purity.

Even with such beam filtering slit electrode 206, it is difficult to completely eliminate the energy contamination which are caused (in the inter-filter passage 221d or the acceleration tube passage 221e) after the mass analysis unit 205. In case the collision reactions, as shown at (b) in FIG. 34, are caused upon the implantation of the P++ ions, for example, there is no proper method for blocking the invasions into the downstream step acceleration tube 208 effectively. In order to eliminate the energy contamination caused by those reactions, therefore, the discharge port of the evacuation system is connected to the vicinity of the acceleration tube passages 221d and 221e to effect the evacuations (even during the implantations) so that the degree of vacuum between the aforementioned beam filtering slit electrodes 206 and the acceleration tube passages 221d and 221e may be held at $1 \times 10^{-5}$ Torrs or, desirably, at $5 \times 10^{-6}$ Torrs or more upon the implantations. The discharge systems provided for this purpose are the evacuation systems 207 and 207' of FIG. 19.

Together with the aforementioned beam filtering slit electrodes, moreover, the evacuation system 207' holds the degree of vacuum of the beam line of the analyzer front passage 221a (shown in FIG. 26) and its vicinity at a high level of $1 \times 10^{-5}$ Torrs or, desirably, $5 \times 10^{-6}$ Torrs, thus reducing the undesired reactions themselves and preventing the energy contamination.

Next, the operations of the charge-up preventing electronic shower generator 210 (which will be shortly referred to as the "E-Generator") and its monitor mechanism will be described with reference to FIGS. 19, 25 and 28 to 30.

As shown in FIG. 28, the electrons, which are generated by the E-generator 210 in association with the generation of the implantation ion beam 221, are showered onto the wafer together with the ion beam 221 so that the wafer 213 has its individual portions prevented from the charge-up. However, the initial set value $I_{EO}$ (of the emission) of the E-Generator 210 ought to be held at a constant level but may be fluctuated or interrupted by some cause. If, in this case, the ion extractions from the ion source 202 are not interrupted for a remarkably short time period, it is impossible to prevent the breakage of the elements on the wafer 213 or the oxide film making the elements. In the present invention, therefore, the electronic shower monitor 211 monitors the emission current $I_E$ of the E-generator 210. When the emission current $I_E$ drops to a level lower than 90% of the set value $I_{EO}$, the power-down signal is transferred to the ion source power supply 201 by the action of the microcomputer constituting the monitor 211 so that the extraction voltage is instantly dropped to a predetermined potential (i.e., the high terminal potential) to interrupt the generation of the ion beam 221 itself.

Next, the relations between the specific ion implanting process to be described hereinafter and the description of the present Embodiment 2 thus far made will be explained in the following. All the variations shown in the present embodiment can be applied to the aforementioned individual implantation processes, but a specific example of a suitable combination will be described in the following.

The beam filtering slit electrode is especially effective for the multivalent ion implantations but is effective in another case as the method of removing the undesired ions.

The cooling of the wafer being implanted is effective for all the steps but for promoting the amorphism to block formation of a transition layer between the amorphous layer and the normal layer. Therefore, the cooling is effective when the thickness of the transition layer is made as thin as possible to facilitate and complete the removal of the defects due to the annealing. Hence, the cooling is especially effective in the ion implanting process for forming the sources and drains of the individual FETs and their modifications. In this case, the temperature of the upper surface of the wafer being implanted is held at a temperature from the room temperature to $-150°$ C. or, desirably, to $0°$ C. or lower. Especially in the concentration for an incomplete amorphism, the temperature is desired to be $-50°$ to $-100°$ C. or lower. In case, on the other hand, Ge$^+$ is implanted for the preamorphism followed by the implantation of an impurity such as B$^+$ which is relatively reluctant to become amorphous, the B$^+$ implantation is executed, while the wafer has been kept at $-50°$ to $-100°$ C. (or further to about $-200°$ C.) after the Ge$^+$ implantation, so that the residual defects after the annealing can be substantially completely removed.

Incidentally in case the aforementioned wafer cooling is accomplished at each ion implanting process, the annealing temperature after the implantation can be as low as $900°$ to $800°$ C.

Incidentally, the "surface temperature or the upper surface temperature of the wafer (exemplified by the Si single crystal)" termed in the present embodiment corresponds to the macroscopic average temperature in the layer region about several microns away from an interface such as an oxide film on the upper surface of the Si single crystal, on which defects may develop due to the implantations.

Next, another example of a semiconductor integrated circuit device fabricating process using the ion implanting apparatus of the present embodiment will be described in the following. This fabricating process is applied to memory cell selecting MOS.FETs Qs constituting the memory cells of a DRAM (Dynamic Random Access Memory) and n-channel MOS.FETs and p-channel MOS.FETs Qp constituting the peripheral circuits. The specific fabricating process for the other example will again be described in the following with reference to FIGS. 5 to 18 (presenting sections showing an essential portion at the individual steps of the processing process). Incidentally, the DRAM is fabricated by the so-called "0.5 microns design rules to have a capacity of 16 Megabits] and the minimum working size of 0.5 microns.

FIG. 5 is a section showing an essential portion of the semiconductor substrate (for a (100) single crystal wafer having a resistivity of 10Ω-cm) 20 at an intermediate step of the DRAM fabricating process. The individual principal planes of the memory cell forming region (at the lefthand side of FIG. 5) and the n-channel MOS.-FET Qn forming region (at the center of FIG. 5) of the substrate 20 made of a p$^-$-type single crystalline silicon are formed with a p$^-$-type well region 22. This p$^-$-type well region 22 is formed by introducing divalent or trivalent ions of B (or BF$_2$) of an impurity concentration of about $5 \times 10^{12}$ atoms/cm$^2$ by the ion implantation method (with an implantation current of 30 μA) using an energy of about 300 to 800 KeV and by heating the substrate 20 in an atmosphere at a high temperature of about $1,100°$ to $1,300°$ C. The principal plane of the p-channel MOS.FET Qp forming region (at the righthand side of FIG. 5) of the peripheral circuit is formed with an n$^-$-type well region 21. The n$^-$-type well region 21 is formed by implanting divalent or trivalent ions of P (phosphor) of an impurity concentration of about $2 \times 10^{13}$ atoms/cm$^2$ by the ion implantation method (with an implantation current of 30 μA) using an energy of about 400 to 900 KeV and by heating the substrate 20 in an atmosphere at a high temperature of about $1,100°$ to $1,300°$ C.

The individual principal planes of the aforementioned well regions 21 and 22 are formed with an element separating field insulating film 23 having a thickness of about 400 to 600 nm. This field insulating film 23 is formed by the selective oxidization (i.e., LOCOS) method.

In the region to be formed with the peripheral circuit, the p$^-$-type well region 22 is formed below the field insulating film 23 with a p-type channel stopper region 24. The p-type channel stopper region 24 is formed by introducing BF$_2$ of an impurity concentration of about $3 \times 10^{13}$ atoms/cm$^2$ into the principal plane of the p$^-$-type well region 22 by the ion implantation method (with an implantation current of 30 μA) using an energy of about 50 to 70 KeV, by heating the substrate 20 at a high temperature of about $1,050°$ to $1,150°$ C. for about 30 to 40 min. in a nitrogen gas atmosphere containing a minute amount (about 1% or less) of oxygen, and by a subsequent oxidization for about 30 to 50 min. By this heat treatment, the impurity introduced into the principal plane of the p$^-$-type well region 22 is extended and diffused so that the p-type channel stopper region 24 is formed at the fabrication step substantially shared by the formation of the field insulating film 23.

The principal plane of the memory cell forming region is formed with a p-type channel stopper region 25A and a p-type semiconductor region 25B. The p-type channel stopper region 25A is formed below the field insulating film 23, and the p-type semiconductor region 25B is formed in an active region. The p-type channel stopper region 25A and the p-type semiconductor region 25B are individually formed by implanting B$^{++}$ of an impurity concentration of about $1 \times 10^{13}$ atoms/cm$^2$ by the ion implantation method (with an implantation current of 20 μA) using a high energy of about 200 to 300 KeV. The p-type channel stopper region 25A is formed by introducing the aforementioned impurity through the field insulating film 23, and the p-type semiconductor region 25B is formed so deep in the principal plane of the p$^-$-type well region 22 as to correspond to the thickness of the field insulating film 23.

The individual active regions of the well regions 22 and 21 are formed with a gate insulating film 26 having a thickness of about 12 to 18 nm. This gate insulating film 26 is formed by steam-oxidizing the substrate 20 at a high temperature of about $800°$ to $1,000°$ C., for example.

The field insulating film 23 and gate insulating film 26 of the memory cell forming region are individually overlaid by a gate electrode 27 of the memory cell selecting MOS.FET Qs. The gate electrode 27 of the memory cell selecting MOS.FET Qs acts as a word line (WL). In the peripheral circuit forming region, the gate insulating film 26 of the p$^-$-type well region 22 is overlaid by the gate electrode 27 of the n-channel MOS.-FET Qn, and the gate insulating film 26 of the n$^-$-type well region 21 is overlaid by the gate electrode 27 of the p-channel MOS.FET Qp. These gate insulating films 27 are made of a polysilicon film having a thickness of about 200 to 300 [nm], for example. This polysilicon film is doped with an n-type impurity (P or As) for reducing the resistance. The gate electrodes 27 are formed by depositing a polysilicon film all over the surface of the substrate 20 by the CVD method, by introducing an n-type impurity into the polysilicon film by the thermal diffusion method, by forming a not-shown SiO$_2$ film thereover, and by depositing an inter-layer insulating film 28 having a thickness of about 250 to 350 [nm] all over the surface of the SiO$_2$ film. The inter-layer insulating film 28 is formed by the CVD method using inorganic silane gases and nitrogen oxide gases, for example, as its source gases. Next, the gate electrodes 27 are formed by anisotropically etching the inter-layer insulating film 28 and the polysilicon film by using the not-shown photoresist mask. Incidentally, the gate electrodes 27 may be formed of a single layer of a refractory metal (Mo, Ti, Ta or W) film or a refractory metal silicide (MoSi$_2$, TiSi$_2$, TaSi$_2$ or WSi$_2$) film. On the other hand, the gate electrodes 27 may be formed of a composite film which is prepared by laminating the aforementioned refractory metal film or its silicide film over the polysilicon film.

Next, as shown in FIG. 6, the field insulating film 23 and the inter-layer insulating film 28 (or the gate electrode 27) are used as the impurity introduction mask to introduce an n-type impurity 29n into the principal plane of the p$^-$-type well region 22. This n-type impurity 29n is introduced in self-alignment into the gate electrode 27. The n-type impurity 29n to be used is P (or As) having an impurity concentration of about $1 \times 10^{13}$ atoms/cm$^2$, for example, and is introduced by the ion implantation method (with an implantation current of 20 to 30 μA) using an energy of about 30 to 50 KeV. Upon the introduction of the n-type impurity 29n, although not shown, the principal plane of the n$^-$-type well region 21 is covered with an impurity introduction mask (e.g., a photoresist film).

Next, the field insulating film 23 and the inter-layer insulating film 28 (or the gate electrode 27) are used as an impurity introduction mask to introduce a p-type impurity 30p into the principal surface of the n$^-$-type well region 21. This p-type impurity 30p is introduced in self-alignment into the gate electrode 27. The p-type impurity 30p to be used is BF$_2$ having an impurity concentration of about $1 \times 10^{13}$ atoms/cm$^2$, for example, and is introduced by the ion implantation method (with an implantation current of 10 μA) using an energy of about 80 KeV. Upon the introduction of the p-type impurity 30p, although not shown, the principal plane of the p$^-$-type well region 22 is covered with an impurity introduction mask (e.g., a photoresist film).

Next, as shown in FIG. 7, the individual side walls of the gate electrode 27 and the overlying inter-layer insulating film 28 are formed with side wall spacers 31. These side wall spacers 31 are formed by depositing a SiO$_2$ film using inorganic silicon gases and nitrogen oxide gases, for example, as the source gases by the CVD method and by accomplishing the anisotropic etching such as the RIE to an extent corresponding to the thickness (e.g., about 130 to 180 nm) of that SiO$_2$ film. The side wall spacers 31 have a length of about 150 [nm] taken in the direction of the gate (or channel).

Next, an n-type impurity 32n is introduced in the present embodiment into the n-channel MOS.FET Qn forming region of the peripheral circuit by using the aforementioned high current type ion implanting apparatus 1. Upon the introduction of the n-type impurity 32n, the side wall spacer 31 is mainly used as the impurity introduction mask. On the other hand, the regions other than the n-channel MOS.FET Qn forming region are covered with a not-shown impurity introduction mask (or photoresist film). The n-type impurity 32n to be used is As (or P) having an impurity concentration of about $5 \times 10^{15}$ atoms/cm$^2$, for example, and is introduced by the ion implantation method (with an implantation current of 20 μA) using an energy of about 70 to 90 KeV. This ion implantation is accomplished for about ten minutes by turning the rotating disc 13 of the ion implanting apparatus 1 at 1,000 r.p.m.

Next, as shown in FIG. 8, by heating the substrate 1, the aforementioned n-type impurity 29n, n-type impurity 32n and p-type impurity 30p are individually extended and diffused to form an n-type semiconductor region 29 of the memory cell selecting MOS.FET Qs, the n-type semiconductor region 29 and n$^+$-type semiconductor region 32 of the n-channel MOS.FET Qn of the peripheral circuit, and a p-type semiconductor region 30 of the p-channel MOS.FET Qp of the peripheral circuit. The aforementioned heat treatment is accomplished for about 20 to 40 min. at a high temperature of about 900° to 1,000° C., for example. The memory cell selecting MOS.FET Qs of the memory cell is completed by forming the n-type semiconductor region 29. Moreover, the n-channel MOS.FET Qn of the peripheral circuit having the LDD structure is completed by forming the n-type semiconductor region 29 and the n$^+$-type semiconductor region 32. Of the p-channel MOS.FET Qp of the peripheral circuit, however, only the p-type semiconductor region 30 forming part of the LDD structure is completed.

Next, an inter-layer insulating film 33 is deposited all over the surface of the substrate 20. This inter-layer insulating film 33 is used as an etching stopper layer when the electrode layer of a later-described information storing capacity element C of the memory cell is to be worked. The inter-layer insulating film 33 is formed to separating the lower electrode layer of the information storing capacity element C and the gate electrodes 27 (or word lines) of the memory cell selecting MOS.-FET Qs electrically from each other. The inter-layer insulating film 33 is formed to thicken the side wall spacer 31 of the p-channel MOS.FET Qp. The inter-layer insulating film 33 is formed of a SiO$_2$, which is deposited by the CVD method using the inorganic silane gases and the nitrogen oxide gases, for example, as the source gases, to have a thickness of about 130 to 180 nm.

Next, as shown in FIG. 9, the aforementioned inter-layer insulating film 33 is removed from one n-type semiconductor region (at the side to be connected with the lower electrode layer of the information storing capacity element C) of the memory cell selecting MOS.-FET Qs to form connection holes 33A and 34. The connection hole 34 is formed in each of the regions defined by side wall spacers 33B which are deposited on the side wall of the side wall spacer 31 when the side wall spacer 31 and the inter-layer insulating film 33 are etched.

Next, as shown in FIG. 10, a polysilicon film 35A is deposited all over the surface of the substrate 20 to form a lower electrode layer of the information storing capacity element C of the memory cell. This polysilicon film 35A is partially connected with the n-type semiconductor region 29 through the aforementioned individual connection holes 33A and 34. The polysilicon film 35A is deposited by the CVD method to have a thickness of about 150 to 250 nm. Into this polysilicon film 35A, there is introduced by the thermal diffusion method an n-type impurity such as P for reducing the resistance after the deposition. This n-type impurity is introduced in such a low concentration that it is much diffused through the connection hole 34 into the n-type semiconductor region 29 but not to the channel forming region side of the memory cell selecting MOS.FET Qs.

Next, a polysilicon film 35B is further deposited over the aforementioned polysilicon film 35A, as shown in FIG. 11. The upper polysilicon film 35B is deposited by the CVD method to have a thickness of about 250 to 350 nm. After the deposition, there is introduced into the upper polysilicon film 35B by the thermal diffusion method an n-type impurity such as P for reducing the resistance. This n-type impurity is introduced in a high concentration for increasing the amount of charge storage of the information storing capacity element C.

Next, the photolithography technology and the anisotropic etching technology are used to work the aforementioned polysilicon films 35A and 35B of the two-layered structure into predetermined shapes, as shown in FIG. 12, to form a lower electrode layer 35 of the information storing capacity element C.

Next, a dielectric film 36 is deposited all over the surface of the substrate 20, as shown in FIG. 13. This dielectric film 36 is formed to have a two-layered structure in which a $Si_3N_4$ film 36A and a $SiO_2$ film 36B are sequentially laminated, for example. The $Si_3N_4$ film 36A is deposited by the CVD method, for example, to have a thickness of about 5 to 7 nm. In case the $Si_3N_4$ 36A is deposited at the normal production level over the lower electrode layer (or polysilicon film) 35, a minute amount of oxygen is carried so that a not-shown natural oxide film (e.g., $NiO_2$ film) is formed between the $Si_3N_4$ film 36 and the lower electrode layer 35.

The upper $SiO_2$ film 36B of the aforementioned dielectric film 36 is formed by oxidizing the lower $Si_3N_4$ film 36A under a high pressure to give a thickness of about 1 to 3 nm.

Next, a not-shown polysilicon film is deposited all over the surface of the substrate 20. This polysilicon film is deposited by the CVD method to have a thickness of about 80 to 120 nm. After this deposition, there is into the polysilicon film introduced by the thermal diffusion method an n-type impurity such as P for reducing the resistance. Subsequently, a not-shown etching mask (of a photoresist film) is formed over the aforementioned polysilicon film all over the surface of the memory cell forming region excepting the connected regions between one n-type semiconductor region 29 of the memory cell selecting MOS.FET Qs and a later-described complementary data line.

After this, as shown in FIG. 14, the aforementioned etching mask is used to anisotropically etch the aforementioned polysilicon film and dielectric film 36 sequentially thereby to form an upper electrode layer 37 of the information storing capacity element C. By forming this upper electrode layer 37, the information storing capacity element C of the so-called "stacked structure" is substantially completed to complete the memory cell M of the DRAM. After this memory M has been completed, the aforementioned etching mask is removed.

Next, as shown in FIG. 15, the substrate 20 is thermally oxidized to form an insulating film (e.g., $SiO_2$ film) 38 over the surface of the upper electrode layer 37 of the aforementioned information storing capacity element C. This insulating film 38 is formed at the step of oxidizing the residual (e.g., polysilicon film) left unetched on the underlying surface (i.e., the surface of the inter-layer insulating film 3) when the aforementioned upper electrode layer 37 is patterned.

Next, the inter-layer insulating film 33 formed at the aforementioned step is anisotropically etched in the region for forming the aforementioned p-channel MIS-FET Qp of the peripheral circuit, to form a side wall spacer 33C on the side wall of the aforementioned side wall spacer 31. This side wall spacer 33C is formed in self-alignment with the gate electrode 27 of the p-channel MOS.FET Qp. The side wall spacer 33C is formed to elongate the side wall spacer 31 of the p-channel MOS.FET Qp in the direction of the gate length. The total gate length size of the side wall spacers 31 and 33 is about 200 nm.

Next, a not-shown insulating film is deposited all over the surface of the substrate 20. This insulating film is used to act as a film for preventing the contamination mainly when an impurity is to be introduced. This insulating film is formed of a $SiO_2$ film, which is deposited by the CVD method using the inorganic silane gases and the nitrogen oxide gases as the source gases, to have a small thickness of about 10 nm.

Next, the aforementioned high current type ion implanting apparatus 1 is used in the present embodiment to introduce a p-type impurity 39p into the region for forming the p-channel MOS.FET Qp of the peripheral circuit, as shown in FIG. 17. Upon the introduction of the p-type impurity 39p, the side wall spacers 31 and 33c are mainly used as the impurity introduction mask. On the other hand, the regions other than the region for forming the p-channel MOS.FET Qp are covered with a not-shown impurity introduction mask (of a photoresist film). The aforementioned p-type impurity 39p used is $BF_2$ (or B) in an impurity concentration of about $3 \times 10^{15}$ atoms/cm$^2$, for example, and is introduced by the ion implantation method (with an implantation current of 20 mA) using an energy of about 80 [KeV]. At this time, the ion implantation is carried out for about 10 minutes while turning the rotating disc 13 of the ion implanting apparatus 1 at a speed of 1,000 r.p.m.

After this, the substrate 20 is heated, as shown in FIG. 18, to extend and diffuse the aforementioned p-type impurity 39p thereby to form a $p^+$-type semiconductor region 39. This heat treatment is accomplished at a high temperature of about 900 to 1,000° C., for example, for 20 to 40 min. By forming the aforementioned $p^+$-type semiconductor region 39, there is completed the p-channel MOS.FET Qp of the peripheral circuit, which has the LDD structure.

Incidentally, the aforementioned 39p ion implanting process may be accomplished in the following manner. In this case, the defects or the like can be completely removed even by a heat treatment of 900° to 800° C. lower than that of the aforementioned annealing. Specifically, $Ge^+$ (or germanium) is first implanted like the aforementioned $BF_2$ in a concentration of $5 \times 10^{14}$ atoms/cm$^2$ with an energy of 10 to 20 KeV. After the implanted portions has been made sufficiently amorphous, $B^+$ (i.e., monovalent ions of boron) is implanted in an impurity concentration of $2 \times 10^{15}$ atoms/cm$^2$ with an energy of 2 to 5 KeV, following by the after-treatments like before. This previous Ge+ implantation will be called the "pre-amorphous ion implantation". In case the B+ (i.e., the monovalent of boron) is implanted without this pre-amorphous treatment, moreover, the temperature of the implanted surface of the wafer is cooled to about $-100°$ C. with an implantation current of 20 mA, in an impurity concentration of $2 \times 10^{15}$ atom/cm$^2$ by the energy of 2 to 5 KeV so that the amorphism may be facilitated like the previous BF$_2$.

Thus, in the DRAM fabricating process of the present embodiment, the aforementioned ion implanting apparatus 1 is used at the step of ion-implanting the substrate 20 with an impurity in a high concentration of about $10^{15}$ atoms/cm$^2$, i.e., the step of forming the n+-type semiconductor region 32 of the n-channel MOS.-FET Qn of the peripheral circuit and the p+-type semiconductor region 39 of the p-channel MOS.FET Qp of the peripheral circuit so that the substrate 20 can be less contaminated by the sputtering of the ion implanting apparatus 1. As a result, the defects induced in the substrate 20 at the time of the ion implantation can be efficiently removed by the subsequent cold (at about 900° to 1,000° C. ) heat treatment so that the electric characteristics of the MOS.FETs Qn and Qp can be prevented from being deteriorated by those defects, to improve the production yield of the DRAM.

Although our invention has been specifically described hereinbefore in connection with its embodiment, it should not be limited to the foregoing embodiment but can naturally be modified in various manners without departing from the gist thereof.

In the foregoing embodiment, the description has been directed to the case in which the present invention is applied to the high current type ion implanting apparatus to be used at the step of introducing an impurity in a high concentration of about $10^{15}$ atoms/cm$^2$ into the substrate 20, but the invention should not be limited thereto. For example, however, the invention can also be applied to a medium current type ion implanting apparatus to be used at the step of introducing an impurity in a medium concentration of about $10^{12}$ to $10^{13}$ atoms/cm$^2$ like the case in which the well region or the channel stopper region is to be formed.

The effects to be obtainable from the representative of the invention to be disclosed in the present embodiment will be briefly described in the following.

Thanks to the structure of the ion implanting apparatus in which at least the surfaces of the members disposed on the passage of the ion beam are made of highly pure silicon, the substrate can be effectively prevented from being contaminated by the sputtering of the ion implanting apparatus, and the defects induced in the substrate at the time of the ion implantation can be efficiently removed by the subsequent heat treatment, so that the electric characteristics of the elements can be prevented from being deteriorated by those defects to improve the production yield of the semiconductor integrated circuit device.

The effects of the representative of the invention disclosed in the present embodiment will be briefly described in the following:

(1) In the ion implanting apparatus, ① a coolant cooled by the refrigerator is introduced to cool the portion contacting with the back of the wafer. In order to improve the thermal conductivity between the wafer and the cooling portion, moreover, gases are introduced into the gap between the wafer and the cooled surface. ② As the method of cooling the wafer back contacting portion, the cooled portion is used as the cold head by applying the principle of the cyro-pump. In this case, too, the gases are introduced in the gap between the wafer and the cooled surface to improve the thermal conductivity. As a result, the wafer temperature at the time of the ion implantation can be dropped to 0° to $-100°$ C. so that the defects, which might otherwise be caused during the implantation, can be reduced to prevent the crystal defects.

The wafer implanting temperature may be dropped, if necessary, to about $-100°$ to $-250°$ C.

(2) In the ion implanting apparatus, ① after the end of the implantation in the vacuum, the wafer is heated to a temperature free from the moisture condensation by using an infrared ray lamp. ② After the end of the ion implantation, the wafer is transferred from the implantation chamber to the preliminary vacuum chamber so that it is caused to restore the atmospheric pressure gradually with the dried hot nitrogen. As a result, the wafer thus implanted can be freed from the condensation when it is extracted from the ion implanting apparatus to the atmosphere.

(3) In the ion implanting apparatus, the electronic shower (i.e., the electron emitting current) monitor and the ion source or the extraction electrode power source are electrically associated to shield the ion beam simultaneously with occurrence of a trouble even in case the electronic shower generator is troubled during the implantation. As a result, the device over the wafer can be prevented from any dielectric breakdown.

(4) In the ion implanting apparatus, ① The mechanical wafer stopper is eliminated to chuck the wafer by means of an electrostatic chuck so that the ion beam may not hit anything other than the wafer. ② The mechanical stopper has its impurity improved (more than 3N), and the its surface to be hit by the beam is improved in its shape so that any substance sputtered to come out may not fly to the wafer. As a result, the wafer stopper holding the wafer is not hit by the beam so that the material aluminum or the contained impurity will not be sputtered. Thus, the wafer can be prevented from being contaminated with the secondary ion beam.

(5) In the ion beam implanting apparatus, ① the beam filter is disposed at the exit of the mass analysis tube so that the contaminant ions produced from the ion source to the exit of the mass analysis tube can be removed. ② A high vacuum pump is interposed between the mass analysis tube and the downstream step acceleration tube to establish a vacuum at (Mean free step of ions) $\geq 10 \times$ (Distance from the exit of the mass analyzing tube to the exit of the downstream step acceleration tube) from the exit of the mass analyzing tube to the inside of the downstream step acceleration tube. ③ At totally two positions, i.e., between the exit of the mass analyzing tube and the downstream step acceleration tube and at the exit of the downstream step acceleration tube, there is interposed two high vacuum pumps to establish a vacuum at the same level as that of the foregoing function ②. As a result, the implantations of the multivalent or molecular ions can be prevented from any energy contamination.

(6) In order to prevent the contamination due to the sputtering from the individual electrodes in the ion passage, the portion to be possibly sputtered, such as the lead-out electrode of the ion source, the analyzing slit or beam filter slit of the mass analyzer, or the downstream step acceleration electrode, or the surface of that portion is covered with such a conducting substance as will not act as a contaminant even if sputtered. The electrode plate as a whole may be made of such (highly pure) substance.

In case the wafer to be treated is made of Si, more specifically, its portion may be suitably doped with Si. The aforementioned electrode to be used is prepared by machining a disc cut from the Si ingot (i.e., highly pure doped Si single crystal) having a resistivity of about 10 $\Omega$—cm, which has been grown by the pull-up method by adding suitable one or more kinds of impurities to a Si material having an impurity concentration of 99.9999999%, for example.

As a result, it is possible to form an ion passage which has neither the charge-up nor the contamination.

(7) In the ion implantation, generally speaking, the beam is deflected about 30 degrees after the mass analysis so as to improve the impurity of the ions. In order to implant the ion beam of high concentration efficiently, according to the present invention, the beam passage is made as short as possible to guide the beam into the treated wafer without deflecting the whole beam effectively (excepting the converging lens of the beam itself) after the analysis.

In order to minimize the shadow effect in accordance with the fine structure of the device, moreover, an arrangement is made to make the beam incident at right angles upon the wafer surface to be treated.

Incidentally, the Si electrode is used in the present invention so that the removal of carbon, oxygen or an alkaline metal is more easier than that of quartz or the like. However, this neither negates nor exclude the effects of using the quartz in a portion of the ion beam passage.

What is claimed is:

1. An ion implanting apparatus including means for generating an ion beam and means for directing said ion beam along a predetermined passage to perform an ion implanting operation on a wafer located at an end of said passage, wherein at least predetermined surfaces of predetermined members of said ion implanting apparatus which are disposed on the passage of the ion beam are made of a conductive material having thereon a thin film of a sufficiently highly pure silicon such that contamination of the wafer by a material of the thin film, sputtered from the thin film by the ion beam, is substantially avoided.

2. An ion implanting apparatus according to claim 1, wherein said predetermined members having said highly pure silicon on at least predetermined surfaces thereof include a slit plate having a slit at a substantial center thereof, which is disposed on the passage of the ion beam and between an acceleration tube of the ion implanting apparatus and the wafer.

3. An ion implanting apparatus according to claim 1, wherein the highly pure silicon has a purity of at least 99.99999999%.

4. An ion implanting apparatus according to claim 1, wherein said conductive material is graphite.

5. An ion implanting apparatus according to claim 1, wherein said conductive material is aluminum.

6. An ion implanting apparatus according to claim 1, wherein said predetermined members of said ion implanting apparatus include a wafer holding means for holding the wafer during the ion implanting operation.

7. An ion implanting apparatus according to claim 1, wherein said sufficiently highly pure Si has a purity of at least 99.9999%.

8. An ion implanting apparatus according to claim 1, wherein said thin coating of sufficiently highly pure Si is a Si coating layer formed by chemical vapor deposition.

9. An ion implanting apparatus according to claim 2, wherein said slit plate is made of neutron irradiated reduced resistance highly pure silicon having a purity of at least 99.9999%.

10. An ion implanting apparatus according to claim 2, wherein at least one portion of the slit plate is made sufficiently conductive such that substantially no charge-up is caused in said slit plate during the ion implantation.

11. An ion implanting apparatus according to claim 10, wherein the at least one portion of the slit plate that is made sufficiently conductive, is made of a highly pure Si single crystal having a purity of at least 99.9999%, doped to have a predetermined conductivity.

12. An ion implanting apparatus comprising:
   (a) an ion generating unit for generating ions to be implanted;
   (b) a plate-shaped extraction electrode disposed in a vicinity of said ion generating unit to have a predetermined potential and having a first slit at its center for allowing said ions to pass therethrough so that said ions may be extracted and accelerated or decelerated to run in a predetermined direction with a predetermined energy;
   (c) mass analyzing means for selecting desired ions from said ions by causing the ions, which have run through said first slit, to invade into a magnetic field;
   (d) an analysis slit plate held at a predetermined potential for allowing the desired ones of the ions, which have passed through a predetermined portion of said mass analyzing means, selectively to pass through a second slit formed at its center;
   (e) an acceleration electrode of a post-acceleration tube held at a predetermined potential and having a third slit at its center for giving a desired implantation energy to the ions, which have passed through said second slit, and allowing them to pass therethrough;
   (f) an implantation chamber for accommodating a plurality of wafers to be implanted with the ions having passed through said third slit; and
   (g) wafer holding means disposed in said implantation chamber for holding predetermined surfaces of said plural wafers, which are to be implanted, to face the implantation ion beam composed of the ions having passed through said third slit, and means for turning said wafers at a high speed,
   with predetermined portions of said ion implanting apparatus being adapted to be contacted by ions generated by the ion generating unit as ions pass from the ion generating unit to said wafers,
   wherein the improvement resides in that at least some of said predetermined portions of the ion implanting apparatus, adapted to be contacted by the ions as the ions pass from the ion generating unit to the plurality of wafers, and which are subject to being sputtered by said ions, are made of a conductive material having thereon a thin film of sufficiently highly pure Si such that contamination of the wafers by material of the thin film, sputtered from the thin film by the ions, is substantially avoided.

13. An ion implanting apparatus according to claim 12, further comprising a vacuum means for providing a vacuum in the passage of the ion beam downstream of said extraction electrode, such that the passage of said ion beam downstream of said extraction electrode is held under a high vacuum not lower than $1 \times 10^{-5}$ Torrs.

14. An ion implanting apparatus according to claim 13, further comprising cooling means for cooling a surface of said wafer holding means contacting with said wafer to $-20°$ C. or lower during the ion implantation.

15. An ion implanting apparatus according to claim 12, wherein the highly pure silicon has a purity of at least 99.99999999%.

16. An ion implanting apparatus according to claim 12, wherein the conductive material, having thereon the thin film, is aluminum.

17. An ion implanting apparatus according to claim 12, wherein said at least some of the predetermined portions of the ion implanting apparatus includes the wafer holding means.

18. An ion implanting apparatus according to claim 12, wherein said sufficiently highly pure Si has a purity of at least 99.9999%.

19. An ion implanting apparatus according to claim 12, wherein said thin coating of sufficiently highly pure Si is a Si coating layer formed by chemical vapor deposition.

* * * * *